(12) United States Patent
Kang et al.

(10) Patent No.: US 10,014,407 B2
(45) Date of Patent: Jul. 3, 2018

(54) SEMICONDUCTOR DEVICE HAVING ASYMMETRIC ACTIVE REGION AND METHOD OF FORMING THE SAME

(71) Applicant: Samsung Electronics Co., Ltd., Suwon-si (KR)

(72) Inventors: Jun-Gu Kang, Hwaseong-si (KR); Myoungkyu Park, Yongin-si (KR); Chulho Chung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/401,176

(22) Filed: Jan. 9, 2017

(65) Prior Publication Data

US 2017/0200823 A1 Jul. 13, 2017

(30) Foreign Application Priority Data

Jan. 8, 2016 (KR) ........................ 10-2016-0002681

(51) Int. Cl.
*H01L 29/78* (2006.01)
*H01L 29/08* (2006.01)
(Continued)

(52) U.S. Cl.
CPC .. *H01L 29/7816* (2013.01); *H01L 21/823412* (2013.01); *H01L 21/823418* (2013.01); *H01L 27/088* (2013.01); *H01L 29/0869* (2013.01); *H01L 29/0886* (2013.01); *H01L 29/1045* (2013.01); *H01L 29/1054* (2013.01); *H01L 29/1095* (2013.01); *H01L 29/161* (2013.01); *H01L 29/66636* (2013.01);
(Continued)

(58) Field of Classification Search
CPC ............. H01L 29/7816; H01L 29/0869; H01L 29/0886; H01L 29/1095; H01L 29/161
See application file for complete search history.

(56) References Cited

U.S. PATENT DOCUMENTS 4,885,618 A * 12/1989 Schubert ........... H01L 21/26533
257/362
6,355,963 B1 * 3/2002 Hiroki ............... H01L 21/26586
257/345
(Continued)

FOREIGN PATENT DOCUMENTS

EP 0460793 A1 * 12/1991 ............. B82Y 20/00
EP 0460793 B1 * 6/1994 ............. B82Y 20/00

OTHER PUBLICATIONS

Kim et al.,InGaAs/InP heterojunction-channel tunneling field-effect transistor for ultra-low operating and standby power application below supply voltage of 0.5 V, Current Applied Physics, 13, 2014, pp. 2051-2054.*
(Continued)

*Primary Examiner* — Earl Taylor
(74) *Attorney, Agent, or Firm* — Muir Patent Law, PLLC

(57) ABSTRACT

Provided are a semiconductor device and a method of forming the same. The semiconductor device includes an active region defined by an isolation layer. A source region portion, a drain region portion and a channel region are located in the active region. The channel region includes a first portion located close to the source region portion and a second portion having a higher threshold voltage than the first portion.

20 Claims, 20 Drawing Sheets

(51) Int. Cl.
*H01L 29/10* (2006.01)
*H01L 29/161* (2006.01)
*H01L 29/66* (2006.01)
*H01L 21/8234* (2006.01)
*H01L 27/088* (2006.01)
*H01L 29/51* (2006.01)
*H01L 29/06* (2006.01)
*H01L 29/165* (2006.01)

(52) U.S. Cl.
CPC .... *H01L 29/66659* (2013.01); *H01L 29/7833* (2013.01); *H01L 29/7835* (2013.01); *H01L 21/823462* (2013.01); *H01L 29/0653* (2013.01); *H01L 29/165* (2013.01); *H01L 29/513* (2013.01)

(56) References Cited

U.S. PATENT DOCUMENTS

| | | | | |
|---|---|---|---|---|
| 6,465,315 B1* | 10/2002 | Yu | H01L 21/26586 | 257/E21.336 |
| 7,419,863 B1* | 9/2008 | Bulucea | H01L 21/823807 | 257/E21.585 |
| 7,446,394 B2* | 11/2008 | Fukuda | H01L 21/02532 | 257/632 |
| 8,053,301 B2* | 11/2011 | Jaeger | H01L 21/823807 | 257/204 |
| 8,198,194 B2* | 6/2012 | Yang | H01L 21/823807 | 257/E21.042 |
| 8,441,000 B2* | 5/2013 | Chen | H01L 29/165 | 257/30 |
| 8,501,601 B2* | 8/2013 | Flachowsky | H01L 21/2254 | 257/E21.618 |
| 8,587,075 B2* | 11/2013 | Bhuwalka | H01L 29/66356 | 257/402 |
| 8,643,121 B2* | 2/2014 | Mueller | H01L 21/26586 | 257/407 |
| 9,018,065 B2* | 4/2015 | Wasyluk | H01L 21/3065 | 156/345.51 |
| 9,362,383 B1* | 6/2016 | Balakrishnan | H01L 29/6653 | |
| 9,620,591 B2* | 4/2017 | Yu | H01L 29/0676 | |
| 9,673,221 B2* | 6/2017 | Degors | H01L 27/1211 | |
| 9,711,597 B2* | 7/2017 | Mori | H01L 29/1033 | |
| 9,711,760 B2* | 7/2017 | Soci | H01L 51/5296 | |
| 9,728,639 B2* | 8/2017 | Xu | H01L 29/7848 | |
| 9,735,279 B2* | 8/2017 | Sato | H01L 29/78684 | |
| 2001/0017390 A1* | 8/2001 | Long | H01L 21/28105 | 257/368 |
| 2007/0178650 A1* | 8/2007 | Chen | H01L 29/165 | 438/301 |
| 2009/0294873 A1* | 12/2009 | Zhu | H01L 21/26586 | 257/401 |
| 2010/0163939 A1* | 7/2010 | Kronholz | H01L 21/823807 | 257/288 |
| 2010/0176450 A1* | 7/2010 | Yang | H01L 29/78618 | 257/347 |
| 2010/0244147 A1* | 9/2010 | Yang | H01L 21/26513 | 257/408 |
| 2010/0258787 A1* | 10/2010 | Chae | H01L 29/0673 | 257/39 |
| 2011/0037101 A1* | 2/2011 | Nakazawa | H01L 27/0605 | 257/192 |
| 2011/0084319 A1* | 4/2011 | Zhu | B82Y 10/00 | 257/288 |
| 2012/0153350 A1* | 6/2012 | Kronholz | H01L 21/26506 | 257/190 |
| 2012/0193708 A1* | 8/2012 | Flachowsky | H01L 21/2254 | 257/335 |
| 2012/0211854 A1* | 8/2012 | Anderson | H01L 27/14614 | 257/458 |
| 2012/0223390 A1* | 9/2012 | Liang | H01L 29/4908 | 257/369 |
| 2012/0228716 A1* | 9/2012 | Harley | H01L 21/823807 | 257/369 |
| 2012/0256268 A1* | 10/2012 | Li | H01L 21/823807 | 257/369 |
| 2013/0285118 A1* | 10/2013 | Majumdar | H01L 21/02381 | 257/192 |
| 2014/0167177 A1* | 6/2014 | Kim | H01L 27/1104 | 257/369 |
| 2015/0028454 A1* | 1/2015 | Cheng | H01L 29/785 | 257/616 |
| 2015/0236092 A1* | 8/2015 | Yu | H01L 29/0676 | 257/29 |
| 2015/0280012 A1* | 10/2015 | Sato | H01L 29/78684 | 257/29 |
| 2016/0211325 A1* | 7/2016 | Mori | H01L 29/7391 | |
| 2016/0322479 A1* | 11/2016 | Liu | H01L 29/66977 | |
| 2017/0005296 A1* | 1/2017 | Soci | H01L 51/5296 | |
| 2017/0084492 A1* | 3/2017 | Balakrishnan | H01L 29/6653 | |
| 2017/0084726 A1* | 3/2017 | Balakrishnan | H01L 29/6653 | |
| 2017/0200823 A1* | 7/2017 | Kang | H01L 29/0869 | |
| 2017/0236897 A1* | 8/2017 | Song | H01L 21/266 | 257/347 |

OTHER PUBLICATIONS

Chien et al., Short channel effects in tunnel field-effect transistors with different configurations of abrupt and graded Si/SiGe heterojunctions, Superlattices and Microstructures, 100, 2016, pp. 857-866.*

Sharma et al., Device and circuit level performance analysis of novel InAs/Si heterojunction double gate tunnel field effect transistor, Superlattices and Microstructures, 94, 2016, pp. 119-130.*

Wang et al., Design Considerations for Tunneling MOSFETs Based on Staggered Heterojunctions for Ultra-Low-Power Applications, IEEE Nanotechnology Materials and Devices Conference, 2009, pp. 196-199.*

Shih et al., Physical operation and device design of short-channel tunnel field-effect transistors with graded silicon-germanium heterojunctions, Journal of Applied Physics, 113, 134507, 2013, pp. 1-7.*

* cited by examiner

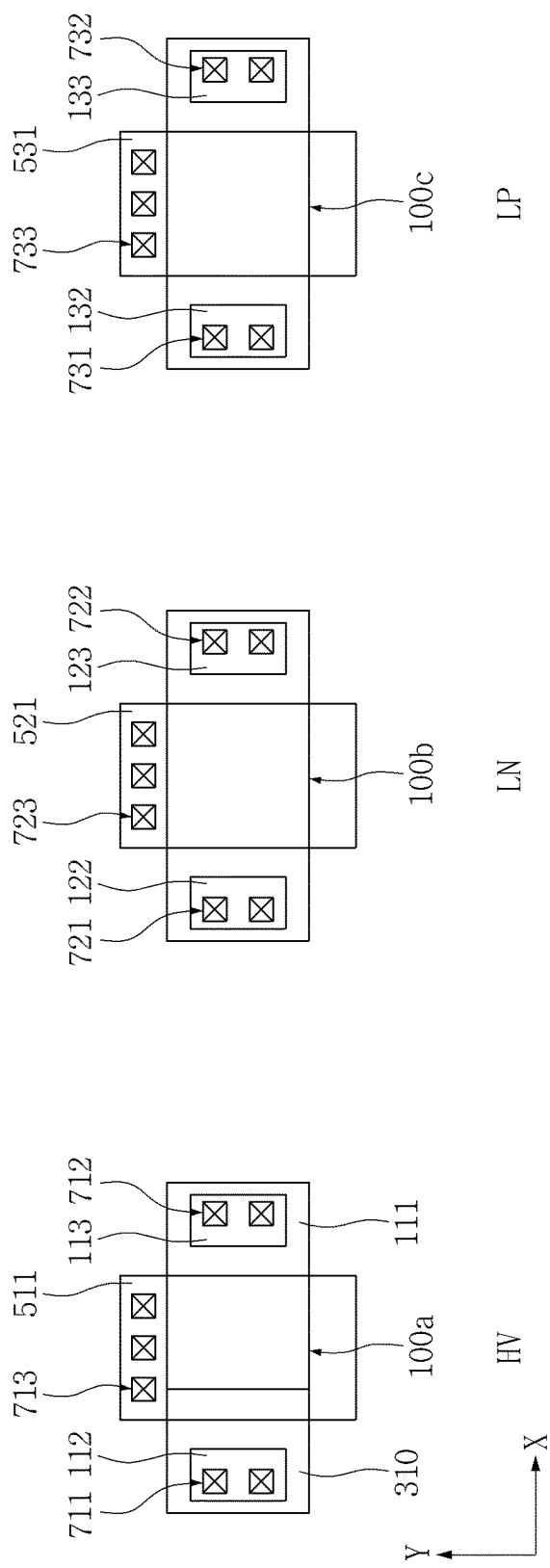

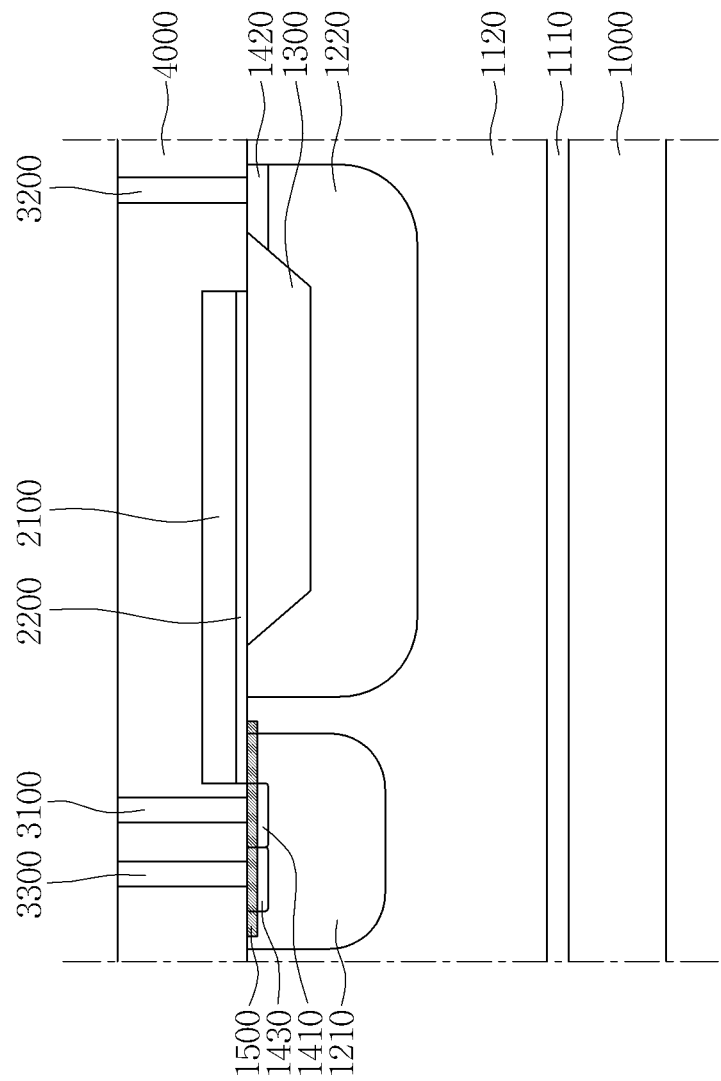

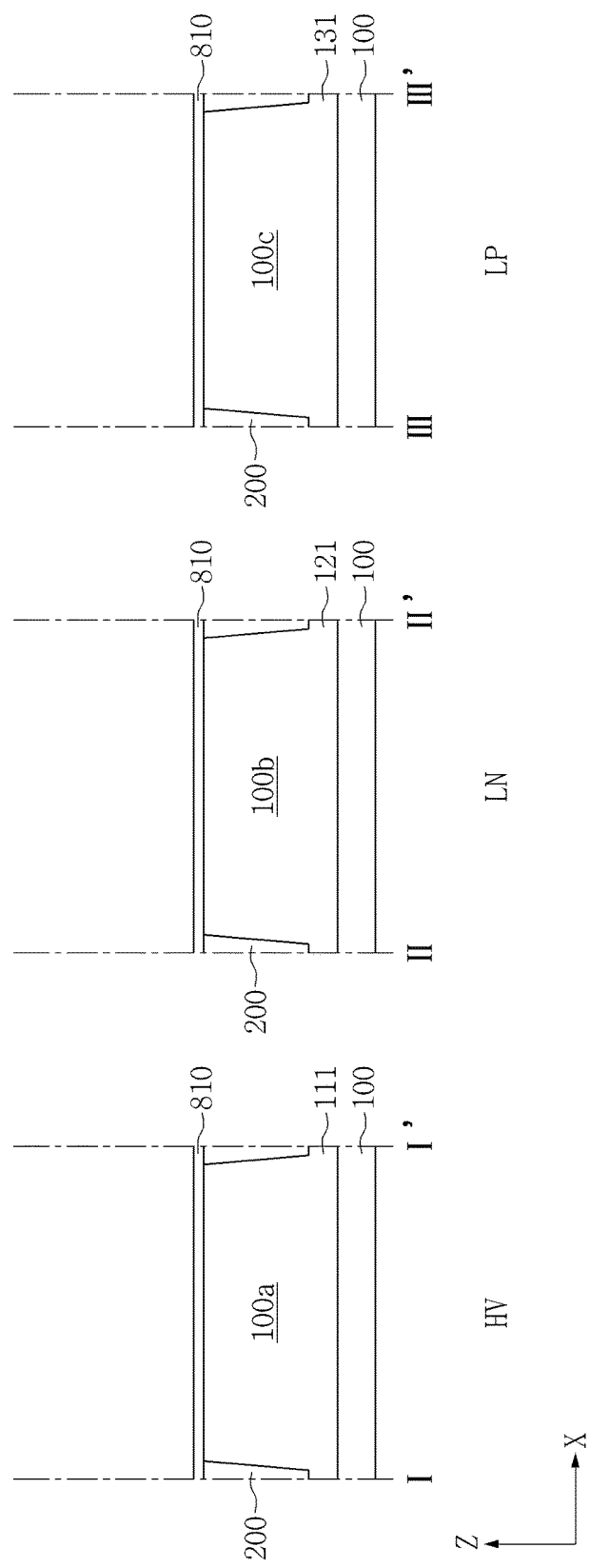

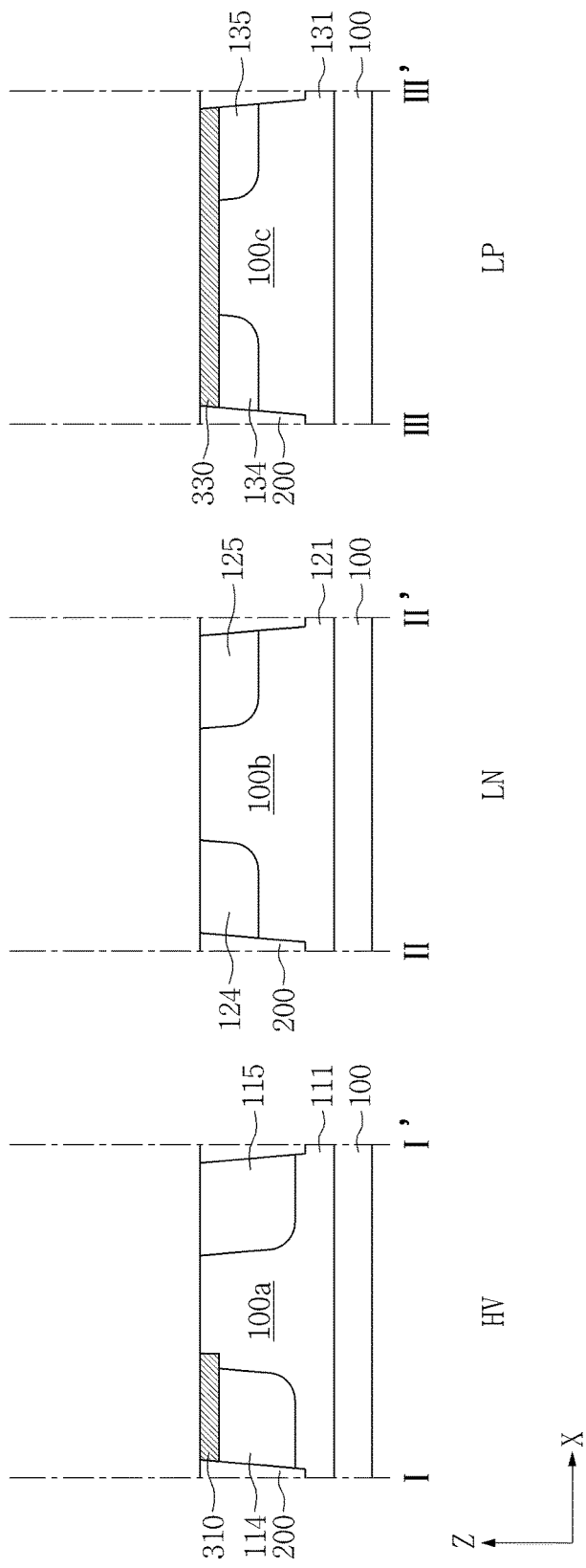

SEMICONDUCTOR DEVICE HAVING ASYMMETRIC ACTIVE REGION AND METHOD OF FORMING THE SAME

CROSS-REFERENCE TO RELATED APPLICATION

This application claims the benefit of priority under 35 U.S.C. § 119 to Korean Patent Application No. 10-2016-0002681, filed on Jan. 8, 2016, in the Korean Intellectual Property Office (KIPO), the disclosure of which is hereby incorporated by reference in its entirety.

BACKGROUND

Field

The disclosed embodiments relate to a semiconductor device including a channel region located in an active region between a source region portion and a drain region portion.

Description of Related Art

A semiconductor device includes an active region defined by an isolation layer. A source region portion, a drain region portion and a channel region located between the source region portion and the drain region portion may be formed in the active region. When the current performance of the channel region is improved, the degree of integration of the semiconductor device may be increased. However, when a threshold voltage of the channel region located close to the drain region portion decreases, a leakage current of the semiconductor device may increase. Therefore, various studies for improving the degree of integration of the semiconductor device are being conducted.

SUMMARY

Embodiments provide a semiconductor device capable of increasing the degree of integration without an increase in a leakage current, and a method of forming the same.

In some aspects, the disclosure is directed to a semiconductor device comprising: an active region including a first portion and a second portion disposed adjacent to the first portion in a first direction; a source region portion disposed in the first portion of the active region; a drain region portion disposed in the second portion of the active region; and a gate pattern extending in a second direction perpendicular to the first direction and intersecting the active region between the source region portion and the drain region portion, wherein the first portion of the active region has a first work function and the second portion of the active region has a second work function, and wherein the first work function is lower than the second work function.

In some aspects, the disclosure is directed to a semiconductor device comprising: a source region portion disposed in a substrate; a drain region portion disposed in the substrate, the drain region portion being separated from the source region portion; a channel region disposed between the source region portion and the drain region portion, the channel region including a first portion and a second portion; and a gate pattern disposed on the channel region of the substrate, wherein the first portion is located closer to the source region portion than to the drain region portion, and wherein a threshold voltage of the second portion is higher than a threshold voltage of the first portion.

In some aspects, the disclosure is directed to a semiconductor device comprising: a source region portion disposed in a substrate; a drain region portion disposed in the substrate; a channel region disposed between the source region portion and the drain region portion, the channel region including a first portion disposed on at least a portion of the source region portion and a second portion disposed on at least a portion of the drain region portion; and a gate pattern disposed on the channel region of the substrate, wherein a threshold voltage of the second portion is higher than a threshold voltage of the first portion, wherein the first portion of the channel region includes a side surface, and wherein the gate pattern vertically overlaps side surface.

BRIEF DESCRIPTION OF THE DRAWINGS

The foregoing and other features and advantages will be apparent from the description of certain embodiments, as illustrated in the accompanying drawings in which like reference numerals denote the same parts throughout the different views. The drawings are not necessarily to scale, emphasis instead placed upon illustrating the principles of the disclosed concepts. In the drawings:

FIG. 4 includes plan views illustrating a semiconductor device according to certain exemplary embodiments;

FIG. 5 is a cross-sectional view illustrating a semiconductor device according to certain exemplary embodiments; and FIGS. 6A to 6M are cross-sectional views sequentially showing a method of forming the semiconductor device according to the exemplary embodiments.

DETAILED DESCRIPTION OF THE EMBODIMENTS

Figure 1A:
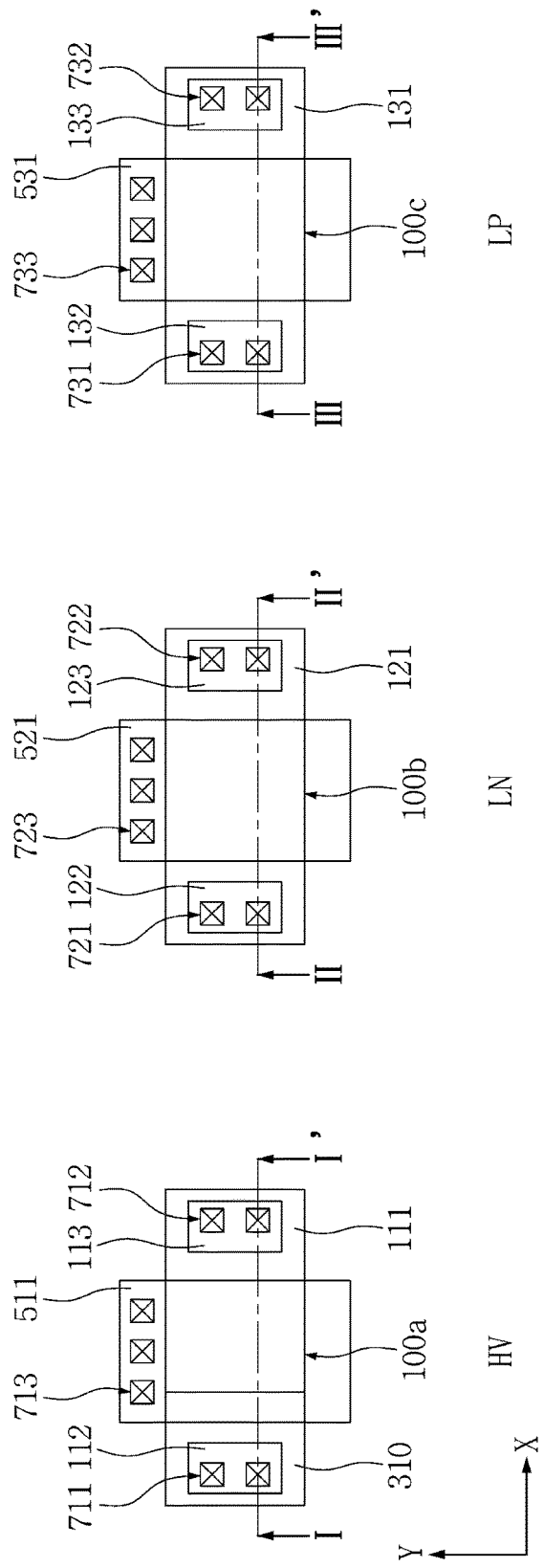
FIG. 1A includes plan views illustrating a semiconductor device according to certain exemplary embodiments.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected. The terms "lowest end level" and "lowest level" may refer to a bottom or bottommost boundary, region, or surface, and the terms "highest end level" and "highest level" may refer to a highest or uppermost boundary, region, or surface.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Exemplary Embodiment

Figure 1B:
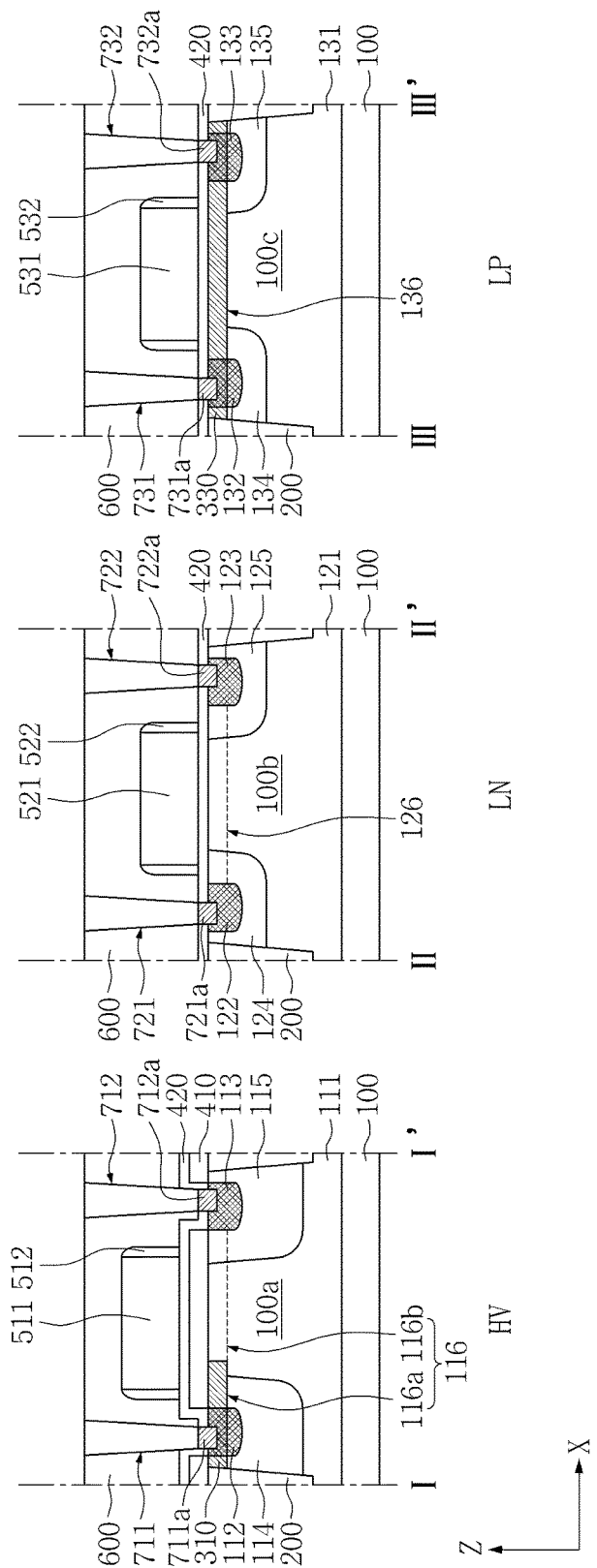
FIG. 1B is cross-sectional views taken along lines I-I', II-II' and of FIG. 1A.

FIG. 1A includes plan views illustrating a semiconductor device according to certain exemplary embodiments. FIG. 1B is cross-sectional views taken along lines I-I', and of FIG. 1A.

Referring to FIGS. 1A and 1B, a semiconductor device according to certain exemplary embodiments may include a substrate 100 including a first portion HV, a second portion LN, and a third portion LP, and an isolation layer 200 located on the substrate 100.

A first well region 111 may be located in the first portion HV of the substrate 100. A second well region 121 may be located in the second portion LN of the substrate 100. A third well region 131 may be located in the third portion LP of the substrate 100.

Each of the first well region 111, the second well region 121, and the third well region 131 may include a conductive impurity. The first well region 111 may include the same conductive impurity as that of the second well region 121 or the third well region 131. For example, the first well region 111 and the second well region 121 may include a P-type impurity, and the third well region 131 may include an N-type impurity. As another example, the first well region 111 and the third well region 131 may include a P-type impurity, and the second well region 121 may include an N-type impurity.

The isolation layer 200 may define a first active region 100a in the first portion HV of the substrate 100. The isolation layer 200 may be formed in a trench in the substrate 100 that surrounds the first active region 100a (with respect to a top down view, such as FIG. 1A) and may contact the first active region 100a at an inner boundary of the isolation layer 200 (with respect to the top down view). The lowest end level of the isolation layer 200 may be higher than the lowest level of the first well region 111. For example, the first active region 100a may include the first well region 111 surrounded by the isolation layer 200.

A first sub-active region 310 may be located in the first portion HV of the substrate 100. The first sub-active region 310 may be located close to an upper end portion of the substrate 100. For example, the highest end level of the first sub-active region 310 may be equal to an upper surface level of the substrate 100. The lowest end level of the first sub-active region 310 may be higher than that of the isolation layer 200. The first active region 100a may include a first portion in which the first sub-active region 310 is located, and a second portion in which the first well region 111 is located.

A length of the first sub-active region 310 in a first direction X may be smaller than a length of the first well region 111 in the first direction X. A length of the first sub-active region 310 in a second direction Y perpendicular to the first direction X may be equal to that of the first well region 111 in the second direction Y. The first sub-active region 310 may be in direct contact with the isolation layer 200. For example, in a plan view, the first portion and the second portion of the first active region 100a may be located in series in the first direction X. A boundary between the first portion and the second portion of the first active region 100a may extend in the second direction Y. For example, the first portion and the second portion of the first active region 100a may be adjacent to one another as they extend in the second direction Y. A length of the first active region 100a in the first direction X may be greater than that of the first active region 100a in the second direction Y.

The first sub-active region 310 may have a lower work function than the first well region 111. The first sub-active region 310 may include a material different from the substrate 100. Generally, SiGe has a conduction band that is about 30 mV lower compared to Si, and a valence band that is about 230 mV lower compared to Si. For example, the substrate 100 may include Si, and the first sub-active region 310 may include SiGe.

A first source region portion 112, a first drain region portion 113, a source double diffused drain ("DDD") region 114, a drain DDD region 115, and a first channel region 116 may be located in the first active region 100a. A source region may be formed by combination of the first source region portion 112 and the source DDD region 114, and the first source region portion 112 may have a doping concentration higher than that of any portion of the doping concentration of the source DDD region 114. A drain region may be formed by combination of the first drain region portion 113 and the drain DDD region 115, and the first drain region portion 113 may have a doping concentration higher than that of any portion of the drain DDD region 115. DDD regions of the embodiments described herein may comprise portions of the active regions doped with two or more different dopants (e.g., P and As) that diffuse at different rates and thus may have different dopant concentration gradient profiles for the different dopants with respect to the vertical direction of such regions.

The first source region portion 112 may be located in the first portion of the first active region 100a. Lengths of the first source region portion 112 in the first direction X and the second direction Y may be smaller than the respective lengths of the first sub-active region 310 in the first direction X and the second direction Y. A certain portion of the first sub-active region 310 may serve as the first source region portion 112. The lowest level of the first source region portion 112 may be lower than the lowest end level of the first sub-active region 310. The first sub-active region 310 may surround a side surface of the first source region portion 112.

The first drain region portion 113 may be separated from the first source region portion 112, and spaced apart from the first source region portion 112 in a horizontal direction. The first drain region portion 113 may be located in the second portion of the first active region 100a. The first drain region portion 113 may be located in the first well region 111. A boundary between the first sub-active region 310 and the first well region 111, which extends in the first direction X, may be located between the first source region portion 112 and the first drain region portion 113. A boundary between the first portion and the second portion of the first active region 100a in the first direction X may be located close to the first source region portion 112. For example, a boundary between the first portion and the second portion of the first active region 100a may be located between a center of a channel region 116 and/or a center of gate pattern 511 and the first source region portion 112. For example, with respect to a vertical cross section (such as that shown in FIG. 1B), a distance between the first drain region portion 113 and the nearest boundary of the first sub-active region 310 to the first drain region portion 113 may be greater than the distance between the first source region portion 112 and this nearest boundary of the first sub-active region 310.

The first drain region portion 113 may include the same conductive impurity as the first source region portion 112. The first source region portion 112 and the first drain region portion 113 may include a conductive impurity different from the first well region 111. For example, when the first well region 111 includes a P-type impurity, the first source region portion 112 and the first drain region portion 113 may include an N-type impurity.

The source DDD region 114 may be located in the first well region 111. The source DDD region 114 may be located under the first sub-active region 310, below a bottom level of the first sub-active region 310. The lower end portion of the first source region portion 112 may be located in the source DDD region 114.

The highest end level of the source DDD region 114 may be equal to the lowest end level of the first sub-active region 310. For example, the highest end level of the source DDD region 114 may be adjacent to the lowest end level of the first sub-active region 310. The highest end level of the source DDD region 114 may be lower than that of the first well region 111.

A length of the source DDD region 114 in the first direction X may be smaller than that of the first sub-active region 310 in the first direction X. The drain DDD region 115 may be separated from the source DDD region 114, and may be spaced apart from the first sub-active region 310 in a horizontal direction. A boundary between the first sub-active region 310 and the first well region 111, which extends in the first direction X, may be located between the source DDD region 114 and the drain DDD region 115.

The drain DDD region 115 may be located in the first well region 111. The first drain region portion 113 may be located in the drain DDD region 115. The highest end level of the drain DDD region 115 may be equal to the highest end level of the first drain region portion 113. The highest end level of the drain DDD region 115 may be equal to the highest end level of the first well region 111. The highest end level of the drain DDD region 115 may be higher than the highest end level of the source DDD region 114.

The drain DDD region 115 may include the same conductive impurity as the source DDD region 114. The source DDD region 114 and the drain DDD region 115 may include the same conductive impurity as the first well region 111. The source DDD region 114 and the drain DDD region 115 may include a conductive impurity different from the first source region portion 112 and the first drain region portion 113. For example, when the first source region portion 112 and the first drain region portion 113 include an N-type impurity, the source DDD region 114 and the drain DDD region 115 may include a P-type impurity.

The first channel region 116 may be located between the first source region portion 112 and the first drain region portion 113. The first channel region 116 may include a first portion 116a located in the first sub-active region 310 and a second portion 116b located in the first well region 111. In some embodiments, the first portion 116a may be disposed on at least a portion of the first source region portion 112 and the second portion 116b may be disposed on at least a portion of the first drain region portion 113. The first portion 116a of the first channel region 116 having a relatively low work function may have a lower threshold voltage than the second portion 116b of the first channel region 116. For example, in the semiconductor device according to certain exemplary embodiments, the first channel region 116 may include a first portion 116a located closer to a first source region portion 112 and a second portion 116b having a higher work function than the first portion 116a and located farther away from the first source region portion 112. The isolation layer 200 may define a second active region 100b in the second portion LN of the substrate 100. The lowest end level of the isolation layer 200 may be higher than the lowest level of the second well region 121. The second active region 100b may include the second well region 121 surrounded by the isolation layer 200. For example, a length of the second active region 100b in the first direction X may be greater than a length of the second active region 100b in the second direction Y.

A second source region portion 122, a second drain region portion 123, a first source lightly doped LDD region 124, a first drain LDD region 125, and a second channel region 126 may be located in the second active region 100b. A source region may be formed by the second source region portion 122 and the first source LDD region 124, and a drain region may be formed by the second drain region portion 123 and the first drain LDD region 125. The second source region portion 122 may have a doping concentration higher than that of any portion of the first source LDD region 124. The second drain region portion 124 may have a doping concentration higher than that of any portion of the first drain LDD region 125. The lightly doped regions 124 and 125 and other similar lightly doped regions are referred to herein as LDD regions, which will be understood to mean "lightly doped drain" regions. Although this may appear inconsistent with respect to referring to portions of the source region portions as lightly doped drain (LDD) regions, it should also be appreciated that each of the source region portions and each of the drain region portions herein may in fact be considered a source/drain (or "S/D") region in that operation of the MOSFET transistors described herein (e.g., those shown in FIGS. 1A and 1B) may determine whether such source/drain region portion functions as a source or a drain. The LDD regions described herein may have a doping concentration less than remaining portions of the source/drain region of which they form (e.g., the second source region portion 122 and second drain region portion 123).

The second drain region portion 123 may be separated from the second source region portion 122, and may be spaced apart from the second source region portion 122 in a horizontal direction. The second drain region portion 123 may include the same conductive impurity as the second source region portion 122. The second source region portion 122 and the second drain region portion 123 may include a conductive impurity different from the second well region 121. For example, when the second well region 121 includes a P-type impurity, the second source region portion 122 and the second drain region portion 123 may include an N-type impurity.

The first source LDD region 124 may surround the second source region portion 122. The second source region portion 122 may be located in the first source LDD region 124. The highest end level of the first source LDD region 124 may be equal to the highest end level of the second well region 121.

The first drain LDD region 125 may be separated from the first source LDD region 124, and may be spaced apart from the first source LDD region 124 in a horizontal direction. The first drain LDD region 125 may surround the second drain region portion 123. The second drain region portion 123 may be located in the first drain LDD region 125. The highest end level of the first drain LDD region 125 may be equal to the highest end level of the second well region 121. The highest end level of the first drain LDD region 125 may be equal to that of the first source LDD region 124.

The first drain LDD region 125 may include the same conductive impurity as the first source LDD region 124. The first source LDD region 124 and the first drain LDD region 125 may include the same conductive impurity as the second well region 121. The first source LDD region 124 and the first drain LDD region 125 may include a conductive impurity different from those of the second source region portion 122 and the second drain region portion 123. For example, when the second source region portion 122 and the second drain region portion 123 include an N-type impurity, the first source LDD region 124 and the first drain LDD region 125 may include a P-type impurity.

The lowest end level of the first source LDD region 124 may be higher than the lowest end level of the source DDD region 114. The lowest end level of the first drain LDD region 125 may be higher than the lowest end level of the drain DDD region 115. For example, a relatively higher voltage may be applied to the first portion HV of the substrate 100 than to the second portion LN of the substrate 100.

The second channel region 126 may be located between the second source region portion 122 and the second drain region portion 123. For example, the second channel region 126 may include the second well region 121 located between the second source region portion 122 and the second drain region portion 123.

The isolation layer 200 may define a third active region 100c in the third portion LP of the substrate 100. The lowest end level of the isolation layer 200 may be higher than the lowest end level of the third well region 131. The third active region 100c may include the third well region 131 surrounded by the isolation layer 200. For example, a length of the third active region 100c in the first direction X may be greater than a length of the third active region 100c in the second direction Y.

A second sub-active region 330 may be located in the third portion LP of the substrate 100. The second sub-active region 330 may be located on the third well region 131. The second sub-active region 330 may cover the entire upper surface of the third well region 131. The third active region 100c may further include the second sub-active region 330 located on the third well region 131.

The highest end level of the second sub-active region 330 may be equal to the highest end level of the second well region 121. The highest end level of the third well region 131 may be lower than the highest end level of the second well region 121. The lowest end level of the second sub-active region 330 may be higher than the lowest end level of the isolation layer 200. For example, the lowest end level of the second sub-active region 330 may be equal to the lowest end level of the first sub-active region 310.

A third source region portion 132, a third drain region portion 133, a second source LDD region 134, a second drain LDD region 135, and a third channel region 136 may be located in the third active region 100c. A source region may be formed by the third source region portion 132 and the second source LDD region 134 and a drain region may be formed by the third drain region portion 133 and the second drain LDD region 135. The third source region portion 132 may have a doping concentration higher than that of any portion of the second source LDD region 134. The third drain region portion 134 may have a doping concentration higher than that of any portion of the second drain LDD region 135.

The lowest level of the third source region portion 132 may be lower than the lowest end level of the second sub-active region 330. Lengths of the third source region portion 132 in the first direction X and the second direction Y may be smaller than lengths of the second sub-active region 330 in the respective first direction X and the second direction Y. A certain portion of the second sub-active region 330 may serve as the third source region portion 132.

The third drain region portion 133 may be separated from the third source region portion 132, and may be spaced apart from the third source region portion 132 in a horizontal direction. The lowest level of the third drain region portion 133 may be lower than the lowest end level of the second sub-active region 330. Lengths of the third drain region portion 133 in the first direction X and the second direction Y may be smaller than lengths of the second sub-active region 330 in the respective first direction X and the second direction Y. A portion of the second sub-active region 330 may serve as the third drain region portion 133.

The third drain region portion 133 may include the same conductive impurity as the third source region portion 132. The third source region portion 132 and the third drain region portion 133 may include a conductive impurity different from the third well region 131. For example, when the third well region 131 includes an N-type impurity, the third source region portion 132 and the third drain region portion 133 may include a P-type impurity.

The second source LDD region 134 and the second drain LDD region 135 may be located in the third well region 131. The lower end portion of the third source region portion 132 may be located in the second source LDD region 134. For example, a bottom most portion of the third source region portion 132 may extend below the second sub-active region 330 and into the second source LDD region 134. The highest end level of the second source LDD region 134 may be equal to the lowest end level of the second sub-active region 330. The lower end portion of the third drain region portion 133 may be located in the second drain LDD region 135. For example, a bottom most portion of the third drain region portion 133 may extend below the second sub-active region 330 and into the second drain LDD region 135. The highest end level of the second drain LDD region 135 may be equal to the lowest end level of the second sub-active region 330. The second drain LDD region 135 may be separated from the second source LDD region 134, and may be spaced apart from the second source LDD region 134 in a horizontal direction.

The second drain LDD region 135 may include the same conductive impurity as the second source LDD region 134. The second source LDD region 134 and the second drain LDD region 135 may include the same conductive impurity as the third well region 131. The second source LDD region 134 and the second drain LDD region 135 may include a conductive impurity different from those of the third source region portion 132 and the third drain region portion 133. For example, when the third source region portion 132 and the third drain region portion 133 include a P-type impurity, the second source LDD region 134 and the second drain LDD region 135 may include an N-type impurity.

The lowest end levels of the second source LDD region 134 and the second drain LDD region 135 may be higher than the lowest end levels of the source DDD region 114 and the drain DDD region 115, respectively. For example, a relatively lower voltage may be applied to the third portion LP of the substrate 100 than to the first portion HV of the substrate 100. The lowest end levels of the second source LDD region 134 and the second drain LDD region 135 may be equal to the lowest end levels of the first source LDD region 124 and the first drain LDD region 125, respectively. For example, a voltage applied to the third portion LP of the substrate 100 may be the same as that applied to the second portion LN of the substrate 100.

The third channel region 136 may be located between the third source region portion 132 and the third drain region portion 133. For example, the third channel region 136 may include the second sub-active region 330 located between the third source region portion 132 and the third drain region portion 133.

A first gate insulating layer 410 and a second gate insulating layer 420 may be disposed on the substrate 100. The first gate insulating layer 410 may be disposed on the first portion HV of the substrate 100 only. The first gate insulating layer 410 may expose upper surfaces of the first source region portion 112 and the first drain region portion 113. The second gate insulating layer 420 may be disposed on the first gate insulating layer 410 in the first portion HV of the substrate 100. The second gate insulating layer 420 may be formed to have a constant thickness as it extends along an upper surface of the substrate 100 including the first gate insulating layer 410. Only the second gate insulating layer 420 may be disposed on the upper surfaces of the first source region portion 112, the first drain region portion 113, the second source region portion 122, the second drain region portion 123, the third source region portion 132, and the third drain region portion 133.

The first gate insulating layer 410 and the second gate insulating layer 420 may include an insulating material. For example, the first gate insulating layer 410 and the second gate insulating layer 420 may include silicon oxide and/or silicon nitride. The second gate insulating layer 420 may include the same material as the first gate insulating layer 410.

A first gate pattern 511, a second gate pattern 521, and a third gate pattern 531 may be disposed on the second gate insulating layer 420. The first gate pattern 511, the second gate pattern 521, and the third gate pattern 531 may be disposed in parallel to one another. For example, the first gate pattern 511, the second gate pattern 521, and the third gate pattern 531 each may extend in the second direction Y.

The first gate pattern 511 may be disposed on the first portion HV of the substrate 100. The first gate pattern 511 may be disposed on the first channel region 116. The first gate pattern 511 may intersect the first active region 100*a* between the first source region portion 112 and the first drain region portion 113, crossing over the first active region 100*a*.

The first gate pattern 511 may vertically overlap a certain portion of the first sub-active region 310. The first gate pattern 511 may overlap a boundary between the first portion 116*a* and the second portion 116*b* of the first channel region 116 in the first direction X, covering the boundary as it extends in the second direction Y. The first sub-active region 310 may include a side surface that extends in the second direction Y and is vertically overlapped by the first gate pattern 511.

The first gate pattern 511 may be disposed close to the first source region portion 112, and the first gate pattern 511 may be formed at a location that is relatively closer in a horizontal plane to the first source region portion 112 than to the first drain region portion 113. For example, the distance between the first source region portion 112 and the first gate pattern 511 in the first direction X may be smaller than the distance between the first drain region portion 113 and the first gate pattern 511 in the first direction X.

A first gate spacer 512 may be disposed on side surfaces of the first gate pattern 511. The first gate spacer 512 may include an insulating material. For example, the first gate spacer 512 may include silicon oxide and/or silicon nitride.

The second gate pattern 521 may be disposed on the second portion LN of the substrate 100. The second gate pattern 521 may be disposed on the second channel region 126. The second gate pattern 521 may intersect the second active region 100*b* between the second source region portion 122 and the second drain region portion 123, crossing over the second active region 100*b*. The second gate pattern 521 may include the same conductive material as the first gate pattern 511.

A second gate spacer 522 may be disposed on side surfaces of the second gate pattern 521. The second gate spacer 522 may include an insulting material. For example, the second gate spacer 522 may include silicon oxide and/or silicon nitride. The second gate spacer 522 may include the same material as the first gate spacer 512.

The third gate pattern 531 may be disposed on the third portion LP of the substrate 100. The third gate pattern 531 may be disposed on the third channel region 136. The third gate pattern 531 may intersect the third active region 100*c* between the third source region portion 132 and the third drain region portion 133, crossing over the third active region 100*c*. The third gate pattern 531 may include the same conductive material as the second gate pattern 521.

A third gate spacer 532 may be disposed on side surfaces of the third gate pattern 531. The third gate spacer 532 may include an insulating material. For example, the third gate spacer 532 may include silicon oxide and/or silicon nitride. The third gate spacer 532 may include the same material as the second gate spacer 522.

An interlayer insulating layer 600 may be disposed on the substrate 100 including the first gate pattern 511, the second gate pattern 521, and the third gate pattern 531. The highest end level of the interlayer insulating layer 600 may be higher than the highest end levels of each of the first gate pattern 511, the second gate pattern 521, and the third gate pattern 531.

The interlayer insulating layer 600 may include an insulating material. For example, the interlayer insulating layer 600 may include silicon oxide and/or silicon nitride.

A first source contact structure 711, a first drain contact structure 712, and a first gate contact structure 713, which pass through the interlayer insulating layer 600, may be disposed in the first portion HV of the substrate 100. For example, in the first portion HV of the substrate, the first source contact structure 711, the first drain contact structure 712, and the first gate contact structure 713 each may extend vertically through the interlayer insulating layer 600.

The first source contact structure 711 may be electrically connected to the first source region portion 112. The first source contact structure 711 may be disposed on an upper surface of the first source region portion 112. The first source contact structure 711 may be in direct contact with the upper surface of the first source region portion 112. For example, the first source contact structure 711 may be in direct contact with the first portion of the first active region 100*a*. The first source contact structure 711 may be in direct contact with the first sub-active region 310.

The first source contact structure 711 may include a conductive material. For example, the first source contact structure 711 may include a metal.

The first source contact structure 711 may include a first source silicide contact 711*a* disposed close to the first source region portion 112. In some embodiments, the first source silicide contact 711*a* may be disposed in the first source region portion 112. The lowest end level of the first source silicide contact 711*a* may be lower than the highest end level of the first sub-active region 310. The lowest end level of the first source silicide contact 711*a* may be higher than the lowest end level of the first sub-active region 310.

The first drain contact structure 712 may be electrically connected to the first drain region portion 113. The first drain contact structure 712 may be disposed on an upper surface of the first drain region portion 113. The first drain contact structure 712 may be in direct contact with the upper surface of the first drain region portion 113. For example, the first drain contact structure 712 may be in direct contact with the second portion of the first active region 100*a*. The first drain contact structure 712 may be in direct contact with the first well region 111.

The first drain contact structure 712 may include a conductive material. For example, the first drain contact structure 712 may include a metal. The first drain contact structure 712 may include the same material as the first source contact structure 711.

The first drain contact structure 712 may include a first drain silicide contact 712*a* disposed close to the first drain region portion 113. In some embodiments, the first drain silicide contact 712*a* may be disposed in the first source region portion 112. The lowest end level of the first drain silicide contact 712*a* may be lower than the highest end level of the first well region 111. The lowest end level of the first drain silicide contact 712*a* may be equal to the lowest end level of the first source silicide contact 711*a*.

The first gate contact structure 713 may be disposed on the first gate pattern 511. The first gate contact structure 713 need not vertically overlap the first active region 100*a*. For example, the first gate contact structure 713 may be separated from the first active region 100*a* in the second direction Y, and may be spaced apart from the first active region 100*a* in the second direction Y.

The first gate contact structure 713 may include a conductive material. For example, the first gate contact structure 713 may include a metal. The first gate contact structure 713 may include the same material as the first source contact structure 711 and the first drain contact structure 712.

A second source contact structure 721, a second drain contact structure 722, and a second gate contact structure 723, which pass through the interlayer insulating layer 600, may be disposed in the second portion LN of the substrate 100. For example, in the second portion LN of the substrate, the second source contact structure 721, the second drain contact structure 722, and the second gate contact structure 723 each may extend vertically through the interlayer insulating layer 600.

The second source contact structure 721 may be electrically connected to the second source region portion 122. The second source contact structure 721 may be disposed on an upper surface of the second source region portion 122. The second source contact structure 721 may be in direct contact with the upper surface of the second source region portion 122.

The second source contact structure 721 may include a conductive material. For example, the second source contact structure 721 may include a metal.

The second source contact structure 721 may include a second source silicide contact 721*a* disposed close to the second source region portion 122. In some embodiments, the second source silicide 721*a* may be disposed in the second source region portion 122. The lowest end level of the second source silicide contact 721*a* may be lower than the highest end level of the second well region 121.

The second drain contact structure 722 may be electrically connected to the second drain region portion 123. The second drain contact structure 722 may be disposed on an upper surface of the second drain region portion 123. The second drain contact structure 722 may be in direct contact with the upper surface of the second drain region portion 123.

The second drain contact structure 722 may include a conductive material. For example, the second drain contact structure 722 may include a metal. The second drain contact structure 722 may include the same material as the second source contact structure 721.

The second drain contact structure 722 may include a second drain silicide contact 722*a* disposed close to the second drain region portion 123. The lowest end level of the second drain silicide contact 722*a* may be lower than the highest end level of the second well region 121. The lowest end level of the second drain silicide contact 722*a* may be equal to the lowest end level of the second source silicide contact 721*a*.

The second gate contact structure 723 may be disposed on the second gate pattern 521. The second gate contact structure 723 need not vertically overlap the second active region 100*b*. For example, the second gate contact structure 723 may be separated from the second active region 100*b* in the second direction Y, and may be spaced apart from the second active region 100*b* in the second direction Y.

The second gate contact structure 723 may include a conductive material. For example, the second gate contact structure 723 may include a metal. The second gate contact structure 723 may include the same material as the second source contact structure 721 and the second drain contact structure 722.

A third source contact structure 731, a third drain contact structure 732, and a third gate contact structure 733, which pass through the interlayer insulating layer 600, may be disposed in the third portion LP of the substrate 100. For example, in the third portion LP of the substrate, the third source contact structure 731, the third drain contact structure 732, and the third gate contact structure 733 each may extend vertically through the interlayer insulating layer 600.

The third source contact structure 731 may be electrically connected to the third source region portion 132. The third source contact structure 731 may be disposed on an upper surface of the third source region portion 132. The third source contact structure 731 may be in direct contact with the upper surface of the third source region portion 132. The third source contact structure 731 may be in direct contact with the second sub-active region 330.

The third source contact structure 731 may include a conductive material. For example, the third source contact structure 731 may include a metal.

The third source contact structure 731 may include a third source silicide contact 731a disposed close to the third source region portion 132. In some embodiments, the third source silicide contact 731a may be disposed in the third source region portion 132. The lowest end level of the third source silicide contact 731a may be lower than the highest end level of the second sub-active region 330. The lowest end level of the third source silicide contact 731a may be higher than the lowest end level of the second sub-active region 330.

The third drain contact structure 732 may be electrically connected to the third drain region portion 133. The third drain contact structure 732 may be disposed on an upper surface of the third drain region portion 133. The third drain contact structure 732 may be in direct contact with the upper surface of the third drain region portion 133. The third drain contact structure 732 may be in direct contact with the second sub-active region 330.

The third drain contact structure 732 may include a conductive material. For example, the third drain contact structure 732 may include a metal. The third drain contact structure 732 may include the same material as the third source contact structure 731.

The third drain contact structure 732 may include a third drain silicide contact 732a disposed close to the third drain region portion 133. In some embodiments, the third drain silicide contact 732a may be disposed in the third source region portion 133. The lowest end level of the third drain silicide contact 732a may be lower than the highest end level of the second sub-active region 330. The lowest end level of the third drain silicide contact 732a may be higher than the lowest end level of the second sub-active region 330. The lowest end level of the third drain silicide contact 732a may be equal to the lowest end level of the third source silicide contact 731a.

The third gate contact structure 733 may be disposed on the third gate pattern 531. The third gate contact structure 733 need not vertically overlap the third active region 100c. For example, the third gate contact structure 733 may be separated from the third active region 100c in the second direction Y, and may be spaced apart from the third active region 100c in the second direction Y.

The third gate contact structure 733 may include a conductive material. For example, the third gate contact structure 733 may include a metal. The third gate contact structure 733 may include the same material as the third source contact structure 731 and the third drain contact structure 732.

In the semiconductor device according to certain exemplary embodiments, the first portion HV of the substrate 100 that is applied with a relatively higher voltage includes a first portion in which a first active region 100a is located in a first source region portion 112, and a second portion having a higher work function than the first portion. Accordingly, in the semiconductor device according to certain exemplary embodiments, the first channel region 116 located in the first active region 100a may include a first portion 116a located close to the first source region portion 112 and a second portion 116b having a higher threshold voltage than the first portion 116a. Therefore, in the semiconductor device according to the embodiment, the current characteristic of the first channel region 116 can be improved without a change in a threshold voltage in a region close to a first drain region portion 113.

In the semiconductor device according to the exemplary embodiments, the length of the first sub-active region 310 in the first direction X is greater than the length of the source DDD region 114 in the first direction X. However, as described in FIG. 2, in a semiconductor device according to another embodiment, the length of the first sub-active region 310 in the first direction X may be smaller than the length of the source DDD region 114 in the first direction X. In this case, the boundary between the first sub-active region 310 and the first well region 111 in the first direction X may be located between the first source region portion 112 and the source DDD region 114. That is, in the semiconductor device according to another exemplary embodiment, the first sub-active region 310 may be located in the source DDD region 114.

Figure 2:
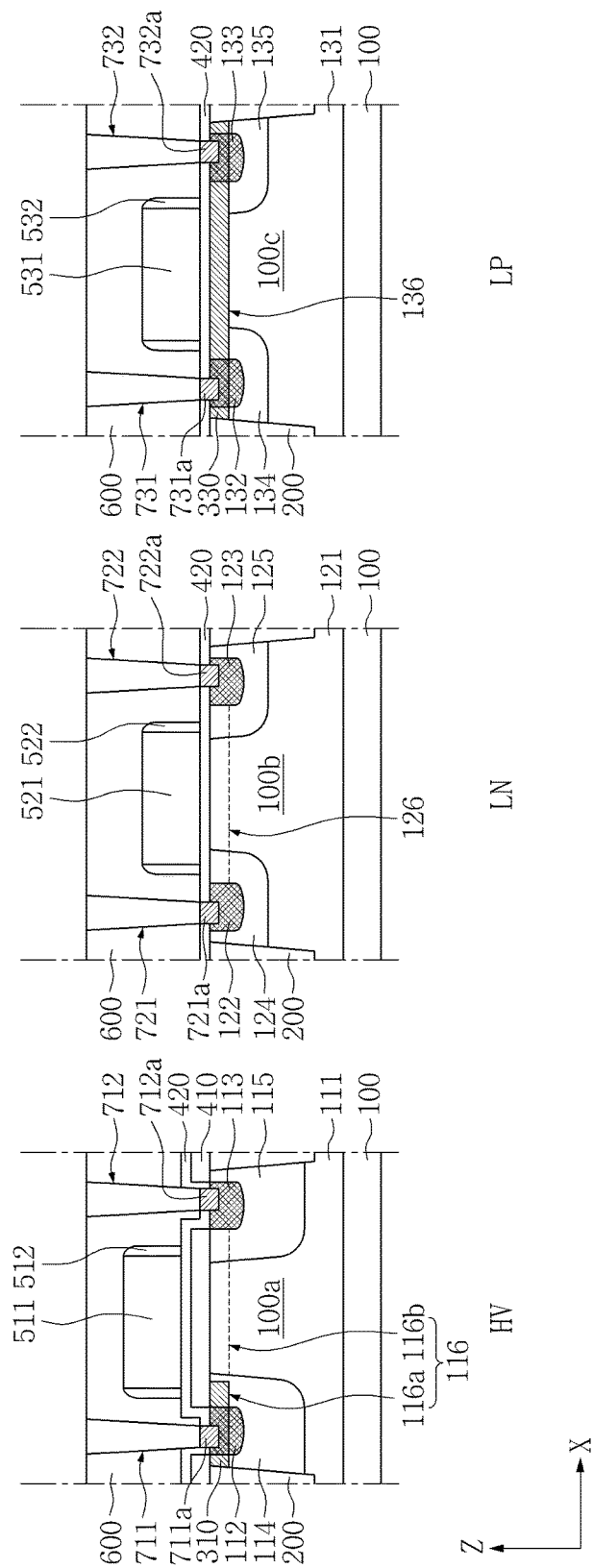
FIG. 2 includes cross-sectional views illustrating a semiconductor device according to certain exemplary embodiments.
Figure 3A:
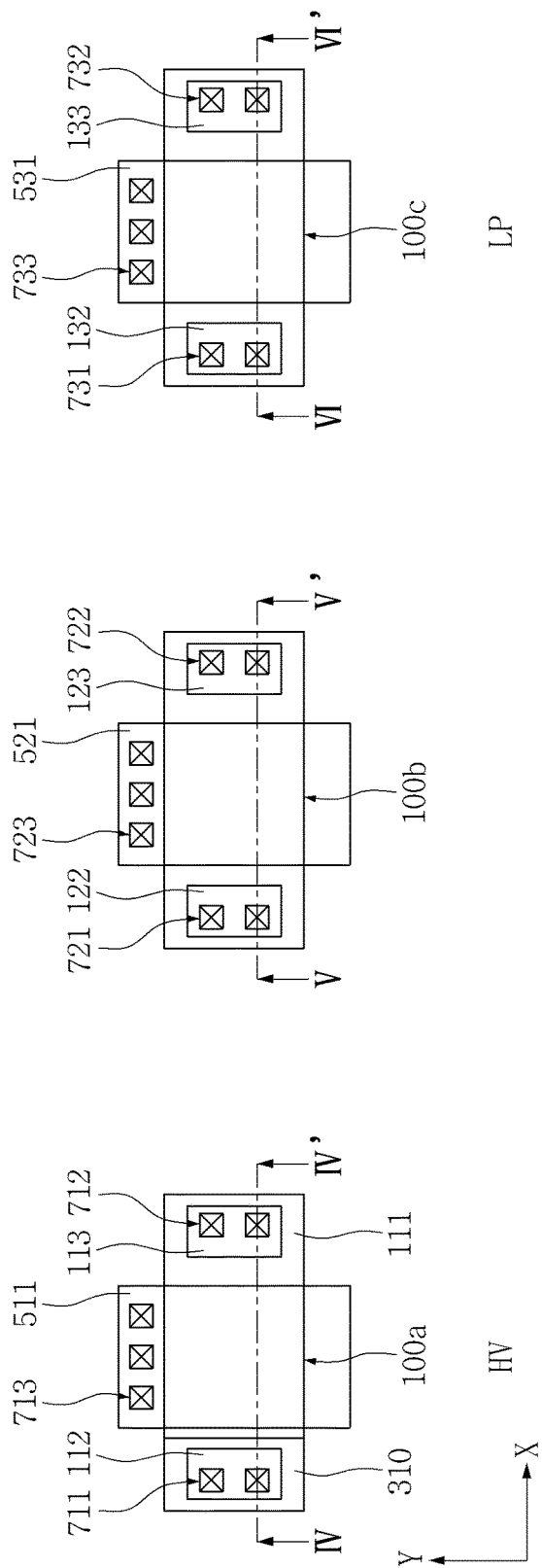
FIG. 3A includes plan views illustrating a semiconductor device according to certain exemplary embodiments.
Figure 3B:
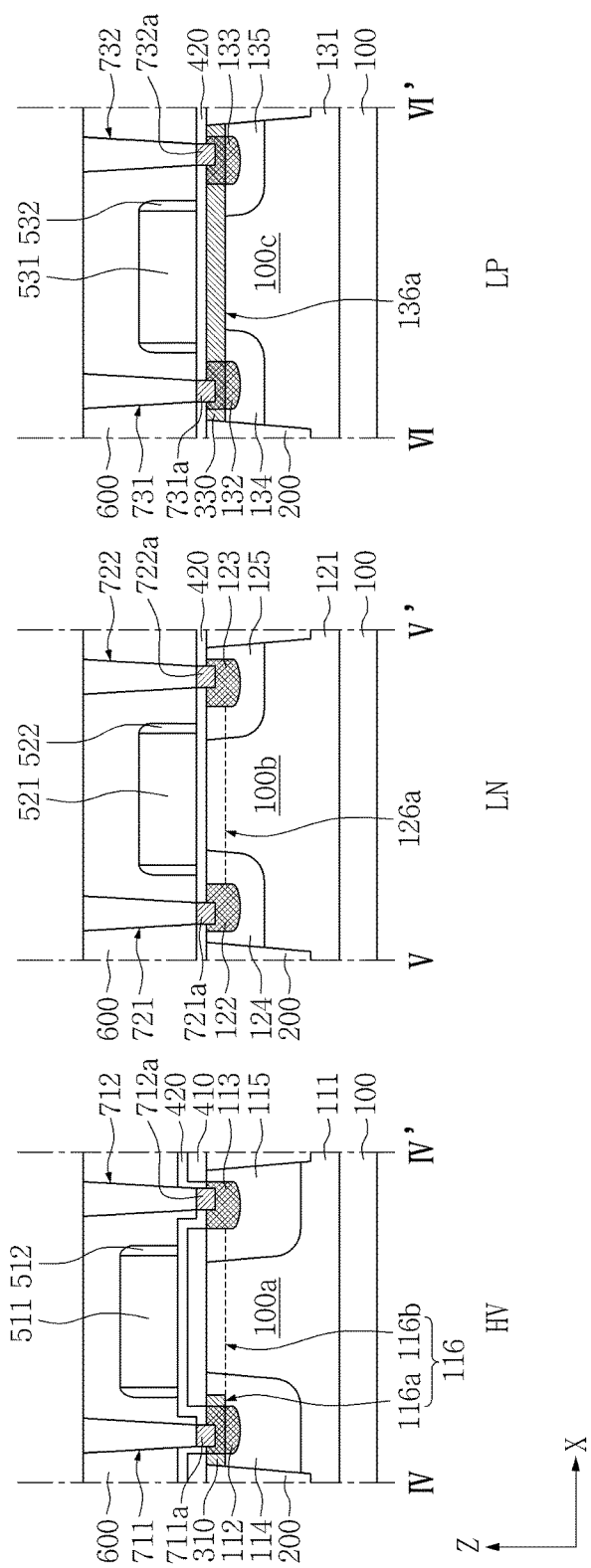
FIG. 3B includes cross-sectional views taken along lines IV-IV', V-V' and VI-VI' of FIG. 3A.

In the semiconductor device according to the exemplary embodiments, a first gate pattern 511 vertically overlaps a certain portion of a first sub-active region 310. For example, as illustrated in FIGS. 1A, 1B, and 2, the first gate pattern 511 overlaps the boundary between the first sub-active region 310 and a first well region 111 in the first direction X. However, as described in FIGS. 3A and 3B, in a semiconductor device according to another exemplary embodiment, the boundary between the first sub-active region 310 and a first well region 111 in the first direction X may be located between the gate pattern 511 and a first source region portion 112. For example, in the semiconductor device according to another embodiment, the first sub-active region 310 may include a side surface that vertically overlaps a first gate spacer 512, disposed on side surfaces of the first gate pattern 511.

As described in connection with FIGS. 1A, 1B, 2, 3A and 3B, the semiconductor device according to the embodiment may adjust the length of the first portion 116a of the first channel region 116 in the first direction X. For example, the length of the first portion 116a in the first direction X may be adjusted relative to the length of the first channel region 116 in the first direction X. The length of the first portion 116a in the first channel region 116 may be proportional to the current performance of the first channel region 116. For example, in the semiconductor device according to the exemplary embodiments, the current characteristic of the first channel region 116 may change based on a horizontal length of the first portion 116a of the first channel region 116. Therefore, in the semiconductor device according to the embodiment, the current characteristic of the first channel region 116 may be adjusted in the first portion HV of the substrate 100 to which is applied a relatively high voltage. For example, the current characteristic of the first channel region 116 may be adjusted by changing a length of the horizontal length of the first portion 116a of the first channel region 116.

In the semiconductor device according to the exemplary embodiments, the length between a first source region portion 112 and the gate pattern 511 in the first direction X is smaller than the length between the gate pattern 511 and the first drain region portion 113 in the first direction X. However, as described in FIG. 4, in a semiconductor according to another exemplary embodiment, the length between the first source region portion 112 and the gate pattern 511 in the first direction X may be equal to the length between the gate pattern 511 and the first drain region portion 113 in the first direction X. For example, the distances between the first source region portion 112 and the gate pattern 511 and between the gate pattern 511 and the first drain region portion 113 may be the same.

FIG. 5 is a cross-sectional view illustrating a semiconductor device according to another embodiment.

Referring to FIG. 5, an exemplary semiconductor device may include a substrate 1000, which includes a barrier region 1110, an impurity region 1120, a body region 1210, a drift region 1220, a drain extension insulating layer 1300, a source region portion 1410, a drain region portion 1420, and a body contact region 1430. The exemplary semiconductor device may further include a gate pattern 2100 disposed on the substrate 1000, a gate insulating layer 2200 disposed between the substrate 1000 and the gate pattern 2100, a source contact structure 3100 connected to the source region portion 1410, a drain contact structure 3200 connected to the drain region portion 1420, a body contact structure 3300 connected to the body contact region 1430, and an interlayer insulating layer 400 surrounding the gate pattern 2100, the source contact structure 3100, the drain contact structure 3200, and the body contact structure 3300.

The lowest level of the barrier region 1110 may be lower than the lowest end level of the impurity region 1120. The lowest end levels of the body region 1210 and the drift region 1220 may be higher than the lowest level of the impurity region 1120. The drift region 1220 may be separated from the body region 1210, and may be spaced apart from the body region 1210 in a horizontal direction. The drain extension insulating layer 1300 may be disposed in the drift region 1220. The source region portion 1410 may be disposed in the body region 1210. The drain region portion 1420 may be disposed in the drift region 1220. The drain extension insulating layer 1300 may be disposed between the source region portion 1410 and the drain region portion 1420. A portion of the drain extension insulating layer 1300 may be disposed under the gate electrode 2100. The body contact region 1430 may be located in the body region 1210. The source region portion 1410 may be located between the drain region portion 1420 and the body contact region 1430. For example, the source region portion 1410 may be disposed between the drain region portion 1420 and the body contact region 1430 in the horizontal direction. The exemplary semiconductor device may be a laterally diffused metal-oxide-semiconductor (LDMOS).

A sub-active region 1500 may be located in a certain portion of an upper end portion of the substrate 1000. The sub-active region 1500 may be located on the body region 1210. A horizontal length of the sub-active region 1500 may be greater than that of the source region portion 1410. For example, the sub-active region 1500 may include a first side surface disposed between the body region 1210 and the drift region 1220 and a second surface disposed between the body region 1210 and the body contact region 1430.

The highest end level of the sub-active region 1500 may be equal to the highest end level of the body region 1210. The lowest level of the source region portion 1410 may be lower than the lowest end level of the sub-active region 1500. For example, a certain portion of the sub-active region 1500 may serve as the source region portion 1410.

The sub-active region 1500 may have a lower work function than the substrate 1000. The sub-active region 1500 may include a material different from the substrate 1000. For example, the substrate 1000 may include Si and the sub-active region 1500 may include SiGe.

FIGS. 6A to 6M are cross-sectional views sequentially showing an exemplary method of forming the semiconductor device.

The method of forming the semiconductor device according to the exemplary embodiment is described with reference to FIGS. 1A, 1B and 6A to 6M. First, as described in FIG. 6A, the exemplary method of the forming the semiconductor device may include a process of providing a substrate 100 including a first portion HV, a second portion LN, and a third portion LP. The exemplary method may further include a process of forming a first well region 111 in the first portion HV of the substrate 100, a process of forming a second well region 121 in the second portion LN of the substrate 100, a process of forming a third well region 131 in the third portion LP of the substrate 100, and a process of forming a isolation layer 200 in the substrate 100.

The process of forming the first well region 111, the process of forming the second well region 121, and the process of forming the third well region 131 may each include a process of doping a conductive impurity into a corresponding portion in the substrate 100. For example, conductive impurities may be doped in the first portion HV of the substrate 100 to form the first well region 111, in the second portion LN of the substrate 100 to form the second well region 121, and in the third portion LP of the substrate 100 to form the third well region 131. The first well region 111 may include the same conductive impurity as the second well region 121 or the third well region 131. For example, the first well region 111 and the second well region 121 may include a P-type impurity, and the third well region 131 may include an N-type impurity. The process of forming the first well region 111 and the process of forming the second well region 121 may be performed simultaneously or concurrently.

The process of forming the isolation layer 200 may include a process of defining a first active region 100a located in the first portion HV of the substrate 100, a second active region 100b located in the second portion LN of the substrate 100, and a third active region 100c located in the third portion LP of the substrate 100. The first active region 100a may be the first well region 111 surrounded by the isolation layer 200. The second active region 100b may be the second well region 121 surrounded by the isolation layer 200. The third active region 100c may be the third well region 131 surrounded by the isolation layer 200.

The isolation layer 200 may include an insulating material. For example, the isolation layer 200 may include silicon oxide and/or silicon nitride. The process of forming the isolation layer 200 may include a process of forming trenches, which define the first active region 100a, the second active region 100b, and the third active region 100c, and a process of filling the trenches with an insulating material.

As illustrated in FIG. 6B, the exemplary method of forming the semiconductor device may include a process of forming a buffer insulating layer 810 on the substrate 100 in which are defined the first active region 100a, the second active region 100b, and the third active region 100c.

The buffer insulating layer 810 may include an insulating material. For example, the buffer insulating layer 810 may include silicon oxide. The process of forming the buffer insulating layer 810 may include a process of oxidizing a surface of the substrate 100. For example, the buffer insulating layer 810 may include oxidized silicon oxide.

Figure 6A:
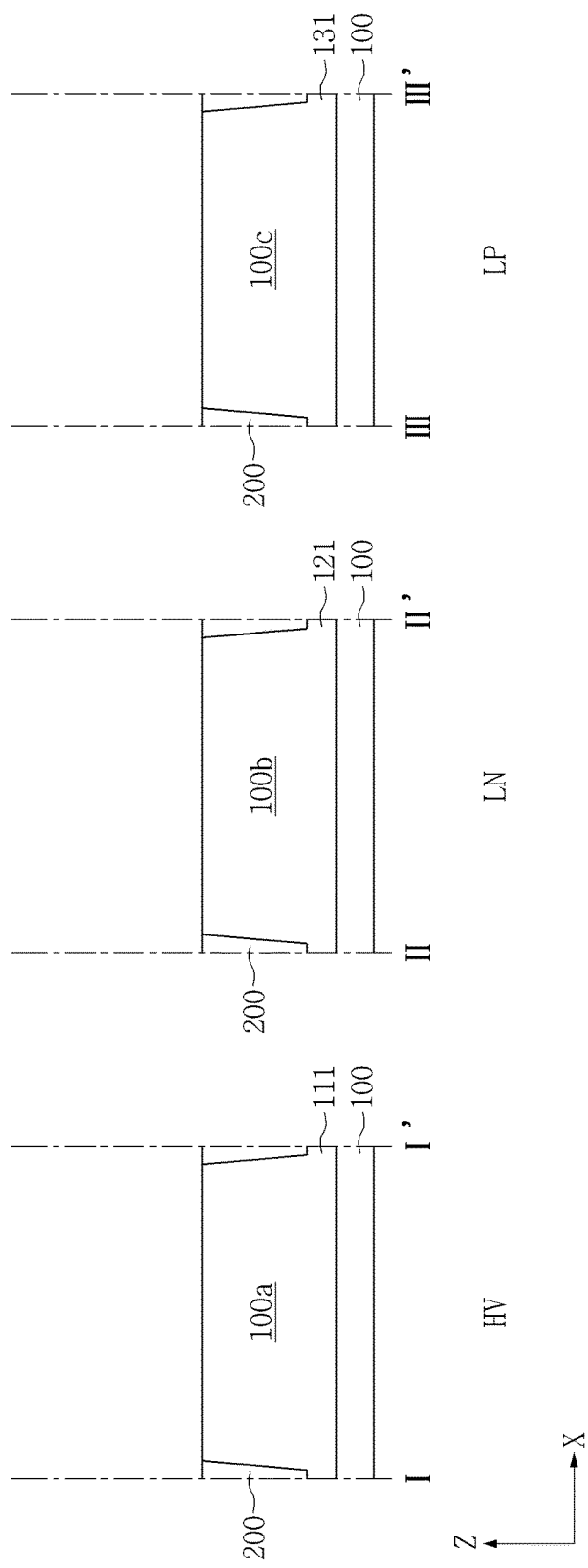
Figure 6C:
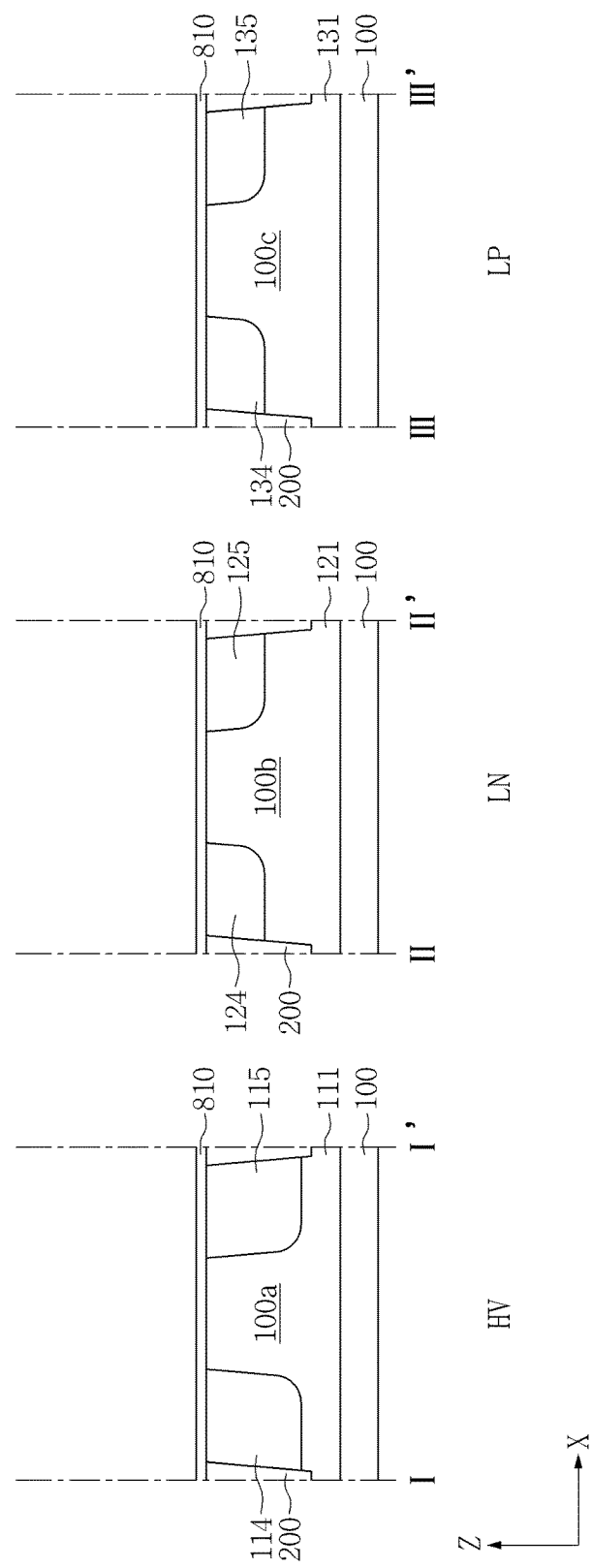

As illustrated in FIG. 6C, the exemplary method of forming the semiconductor device may include a process of forming a source DDD region 114, a drain DDD region 115, a first source LDD region 124, a first drain LDD region 125, a second source LDD region 134, and a second drain LDD region 135 in the substrate 100 in which the buffer insulating layer 810 is formed.

The process of forming the source DDD region 114, the drain DDD region 115, the first source LDD region 124, the first drain LDD region 125, the second source LDD region 134, and the second drain LDD region 135 may include a process of forming the source DDD region 114 and the drain DDD region 115 in the first active region 100a, a process of forming the first source LDD region 124 and the first drain LDD region 125 in the second active region 100b, and a process of forming the second source LDD region 134 and the second drain LDD region 135 in the third active region 100c.

The process of forming the source DDD region 114 and the drain DDD region 115 may include a process of doping a conductive impurity into a certain portion of the first active region 100a. The source DDD region 114 and the drain DDD region 115 may include the same conductive impurity as the first active region 100a. For example, the source DDD region 114 and the drain DDD region 115 may include a P-type impurity. The concentration of an impurity in the source DDD region 114 and the drain DDD region 115 may be lower than that in the first active region 100a. For example, the concentration of a P-type impurity may be greater in the first active region 100a than the concentrations of the P-type impurity in the source DDD region 114 and the drain DDD region 115.

The source DDD region 114 and the drain DDD region 115 may be formed close to the isolation layer 200. In some embodiments, the source DDD region 114 and the drain DDD region 115 may be adjacent to the isolation layer 200. The drain DDD region 115 may be separated from the source DDD region 114 in a horizontal direction. In some embodiments, the first active region 100a may be disposed between the drain DDD region 115 and the source DDD region 114. For example, the source DDD region 114 and the drain DDD region 115 may be formed close to respective facing side surfaces of the first active region 100a. The lowest levels of the source DDD region 114 and the drain DDD region 115 may be higher than the lowest end level of the isolation layer 200.

The process of forming the first source LDD region 124 and the first drain LDD region 125 may include a process of doping a conductive impurity into a certain portion of the second active region 100b. The first source LDD region 124 and the first drain LDD region 125 may include the same conductive impurity as the second active region 100b. For example, the first source LDD region 124 and the first drain LDD region 125 may include a P-type impurity. The concentration of an impurity in the first source LDD region 124 and the first drain LDD region 125 may be lower than that in the second active region 100b. For example, the concentration of a P-type impurity may be greater in the second active region 100b than the concentrations of the P-type impurity in the first source LDD region 124 and the first drain LDD region 125.

The first source LDD region 124 and the first drain LDD region 125 may be formed close to the isolation layer 200. In some embodiments, the first source LDD region 124 and the first drain LDD region 125 may be adjacent to the isolation layer 200. The first drain LDD region 125 may be separated from the first source LDD region 124 in a horizontal direction. In some embodiments, the second active region 100b may be disposed between the first source LDD region 124 and the first drain LDD region 125. For example, the first source LDD region 124 and the first drain LDD region 125 may be formed close to respective facing surfaces of the second active region 100b. The lowest levels of the first source LDD region 124 and the first drain LDD region 125 may be higher than the lowest end level of the isolation layer 200.

The lowest levels of the first source LDD region 124 and the first drain LDD region 125 may be higher than the respective lowest levels of the source DDD region 114 and the drain DDD region 115. For example, a relatively higher voltage may be applied to the first portion HV of the substrate 100 than to the second portion LN of the substrate 100.

The process of forming the second source LDD region 134 and the second drain LDD region 135 may include a process of doping a conductive impurity into a certain portion of the third active region 100c. The second source LDD region 134 and the second drain LDD region 135 may include the same conductive impurity as the third active region 100c. For example, the second source LDD region 134 and the second drain LDD region 135 may include an N-type impurity. The concentration of an impurity in the second source LDD region 134 and the second drain LDD region 135 may be lower than that in the third active region 100c. For example, the concentration of an N-type impurity may be greater in the third active region 100c than the concentrations of the N-type impurity in the second source LDD region 134 and the second drain LDD region 135.

The second source LDD region 134 and the second drain LDD region 135 may be formed close to the isolation layer 200. In some embodiments, the second source LDD region 134 and the second drain LDD region 135 may be adjacent to the isolation layer 200. The second drain LDD region 135 may be separated from the second source LDD region 134 in a horizontal direction. In some embodiments, the third active region 100c may be disposed between the second source LDD region 134 and the second drain LDD region 135. For example, the second source LDD region 134 and the second drain LDD region 135 may be formed close to respective facing side surfaces of the third active region 100c. The lowest levels of the second source LDD region 134 and the second drain LDD region 135 may be higher than the lowest end level of the isolation layer 200.

The lowest levels of the second source LDD region 134 and the second drain LDD region 135 may be higher than the lowest levels of the source DDD region 114 and the drain DDD region 115. The lowest levels of the second source LDD region 134 and the second drain LDD region 135 may be equal to the lowest levels of the first source LDD region 124 and the first drain LDD region 125. For example, a voltage applied to the third portion LP of the substrate 100 may be the same as the voltage applied to the second portion LN of the substrate 100.

Figure 6D:
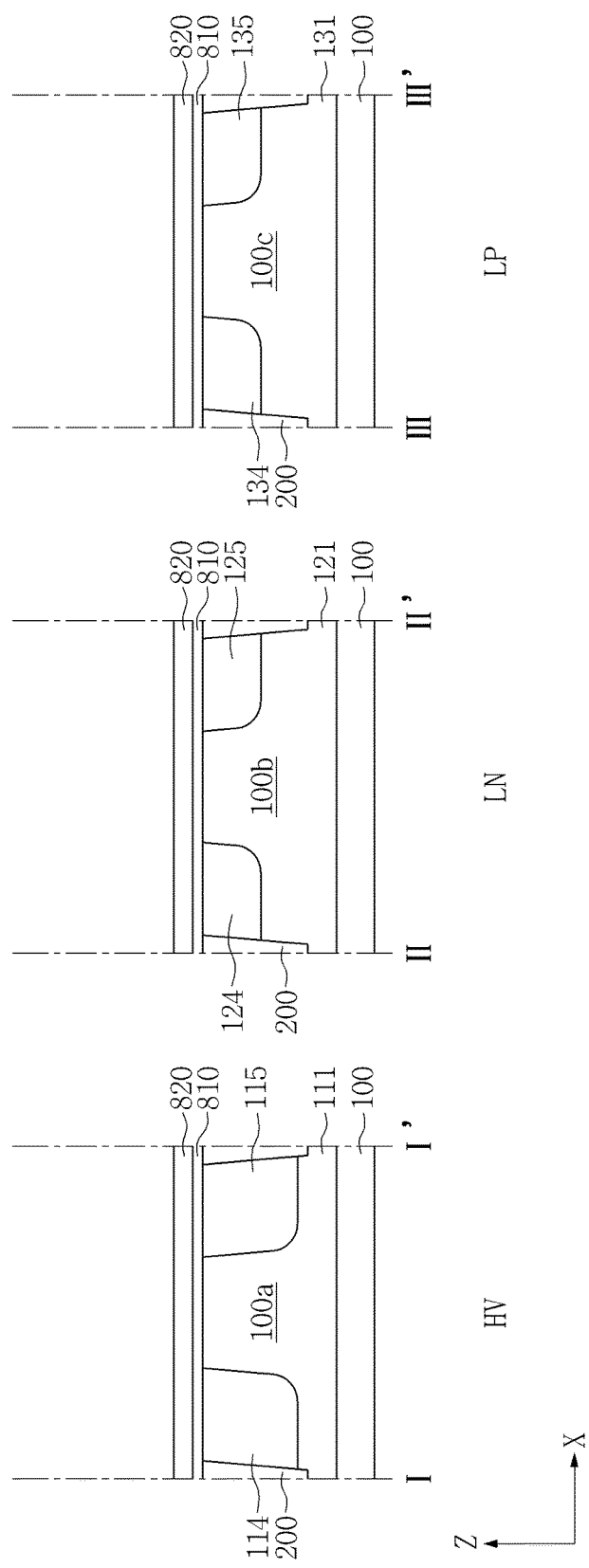

As illustrated in FIG. 6D, the exemplary method of forming the semiconductor device may include a process of forming a hard mask 820 on the buffer insulating layer 810 of the substrate 100 in which are formed the source DDD region 114, the drain DDD region 115, the first source LDD region 124, the first drain LDD region 125, the second source LDD region 134, and the second drain LDD region 135.

The hard mask 820 may include an insulating material. The hard mask 820 may have an etch selectivity with respect to the buffer insulating layer 810. For example, the hard mask 820 may include silicon nitride.

Figure 6E:
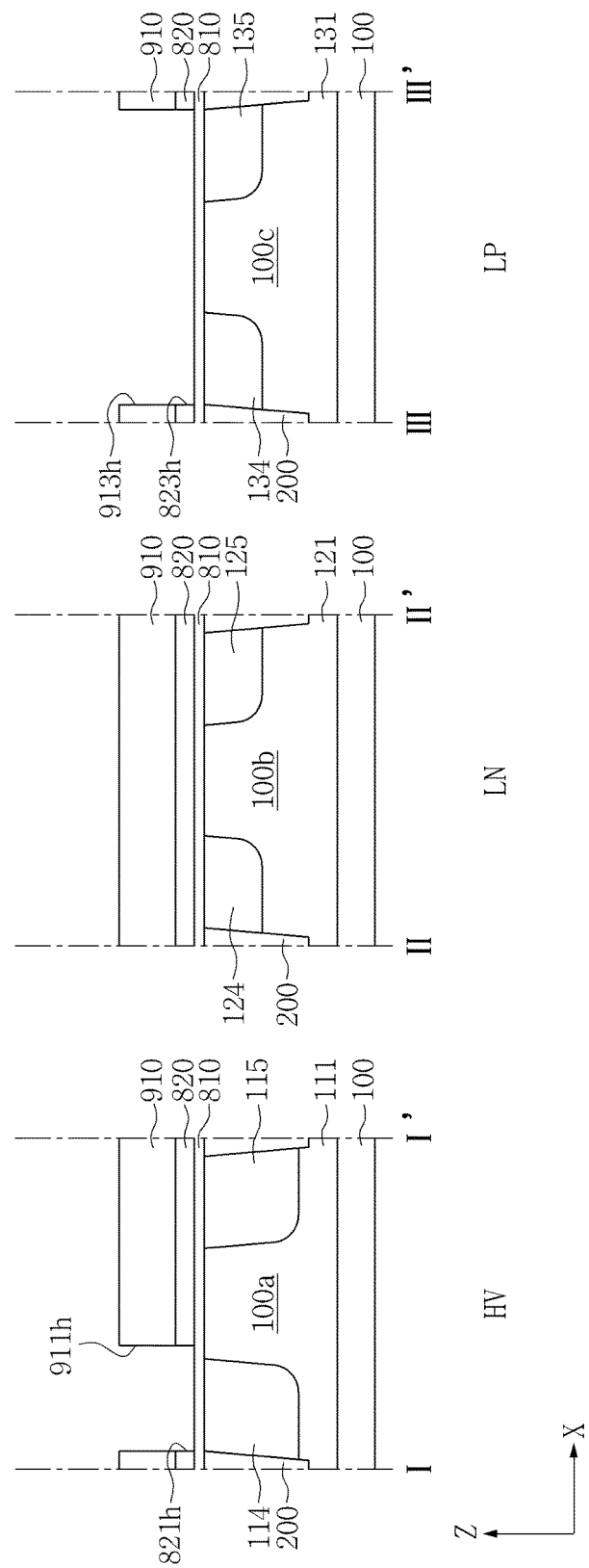

As illustrated in FIG. 6E, the exemplary method of forming the semiconductor device may include a process of forming a first mask opening 821h and a second mask opening 823h in the hard mask 820.

The process of forming the first mask opening 821h and the second mask opening 823h may include a process of forming a pattern mask 910 including a first pattern opening 911h and a second pattern opening 913h on the hard mask 820, and a process of patterning the hard mask 820 using the pattern mask 910 as an etch mask.

The pattern mask 910 may include a photosensitive material. For example, the pattern mask 910 may include a photoresist.

The first mask opening 821h may be formed on the source DDD region 114 of the first active region 100a. In some embodiments, the first mask opening 821h may be formed on the source DDD region 114 and a portion of the first active region 100a. A horizontal length of the first mask opening 821h may be smaller than that of the first active region 100a. The horizontal length of the first mask opening 821h may be larger than that of the source DDD region 114. A first side surface of the first mask opening 821h may be formed above the boundary between the source DDD region 114 and the isolation layer 200. A second side surface of the first mask opening 821h may be disposed on the first active region 100a between the source DDD region 114 and the drain DDD region 115. The second side surface of the first mask opening 821h between the source DDD region 114 and the drain DDD region 115 may be disposed close to the source DDD region 114.

The second mask opening 823h may be formed on the third active region 100c. A horizontal length of the second mask opening 823h may be equal to that of an upper surface of the third active region 100c.

Figure 6F:
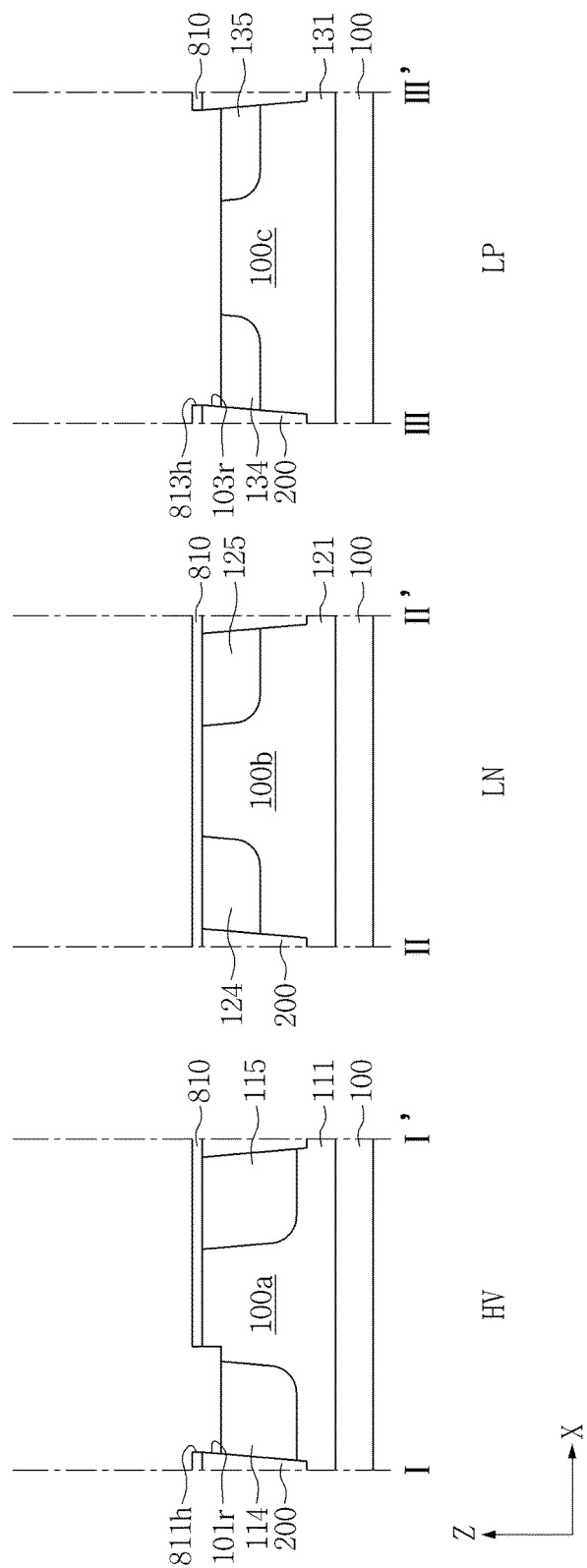

As illustrated in FIG. 6F, the exemplary method of forming the semiconductor device may include a process of forming a first recessed region 101r and a second recessed region 103r in the substrate 100 using the hard mask 820 in which the first mask opening 821h and the second mask opening 823h are formed. The first recessed region 101r may be formed in the first portion HV of the substrate 100, and the second recessed region 103r may be formed in the third portion LP of the substrate 100.

The process of forming the first recessed region 101r and the second recessed region 103r may include a process of removing the pattern mask 910, a process of forming a first buffer opening 811h and a second buffer opening 813h on the buffer insulating layer 810 using the hard mask 820 as an etch mask, in which the first mask opening 821h and the second mask opening 823h are formed, a process of recessing the substrate 100 exposed by the first buffer opening 811h and the second buffer opening 813h, and a process of removing the hard mask 820.

In the exemplary method of forming the semiconductor device, the hard mask 820 is removed after recessing the substrate 100 exposed by the first buffer opening 811h and the second buffer opening 813h. However, in a method of forming a semiconductor device according to another embodiment, the first recessed region 101r and the second recessed region 103r may be formed in the substrate 100 using the buffer insulating layer 810 including the first buffer opening 811h and the second buffer opening 813h after the hard mask 820 is removed.

When the first recessed region 101r is formed, the highest end level of the source DDD region 114 may become lower than the highest end level of the drain DDD region 115. When the second recessed region 103r is formed, the highest end level of the third active region 100c may be lower than the highest end level of the second active region 100b. For example, by forming the second recessed region 103r, the highest levels of the second source LDD region 134 and the second drain LDD region 135 may become lower than the highest levels of the first source LDD region 124 and the first drain LDD region 125, respectively.

Figure 6G:
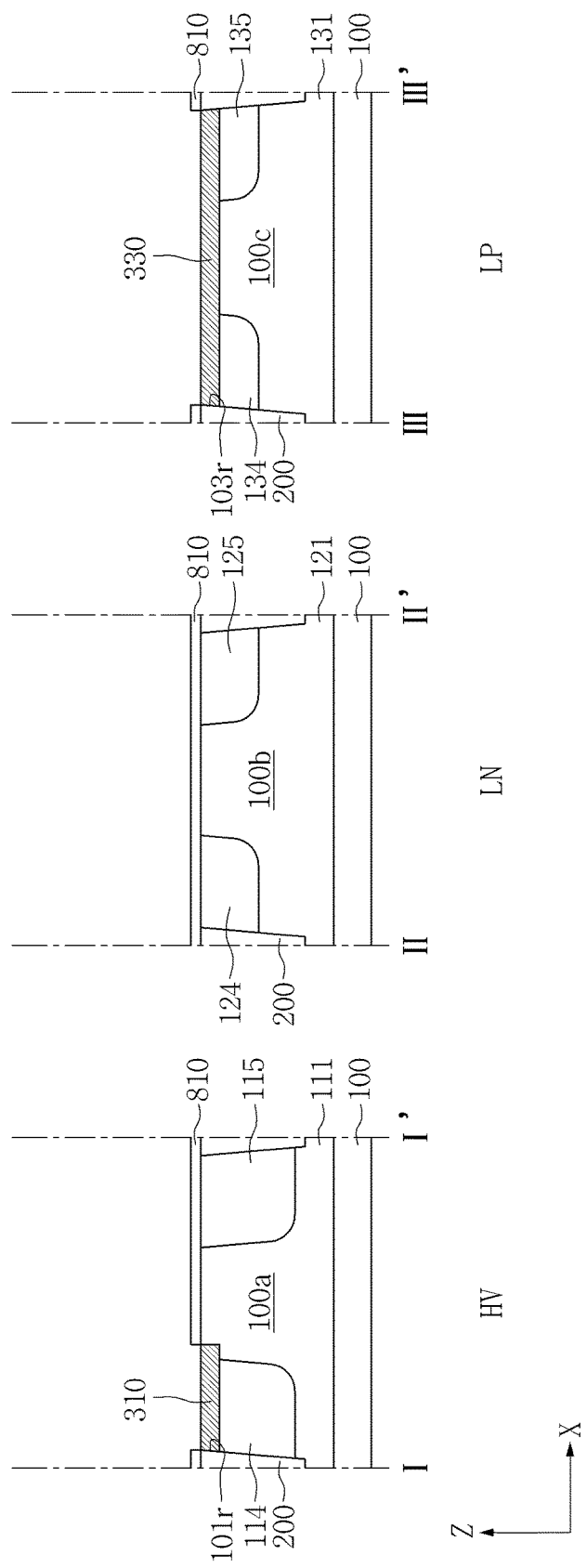

As illustrated in FIG. 6G, the exemplary method of forming the semiconductor device may include a process of forming a first sub-active region 310 and a second sub-active region 330 in the first recessed region 101r and the second recessed region 103r of the substrate 100, respectively. In some embodiments, the first sub-active region 310 and the second sub-active region 330 may be formed to a height that is at least equal to a lower level of the buffer insulating layer 810 in a vertical direction (e.g., a Z-direction).

The process of forming the first sub-active region 310 and the second sub-active region 330 may include a process of forming a selective epitaxial growth (SEG). The first sub-active region 310 and the second sub-active region 330 may be formed of a material having a lower work function than the substrate 100. For example, when the substrate 100 includes Si, the first sub-active region 310 and the second sub-active region 330 may include SiGe. SiGe has the conduction band that is about 30 mV lower and the valence band that is about 230 mV lower compared to Si.

With the formation of the first sub-active region 310, the first active region 100a may include a first portion where the first sub-active region 310 is located and a second portion where the first well region 111 is located. With the formation of the second sub-active region 330, the third active region 100c may include a first portion where the second sub-active region 330 is location and a second portion where the third well region 131 is located.

As illustrated in FIG. 6H, the exemplary method of forming the semiconductor device may include a process of removing the buffer insulating layer 810 disposed on the substrate 100 in which the first sub-active region 310 and the second sub-active region 330 are formed.

The process of removing the buffer insulating layer 810 may include a process of cleaning a surface of the substrate 100 in which the first sub-active region 310 and the second sub-active region 330 are formed.

Figure 6I:
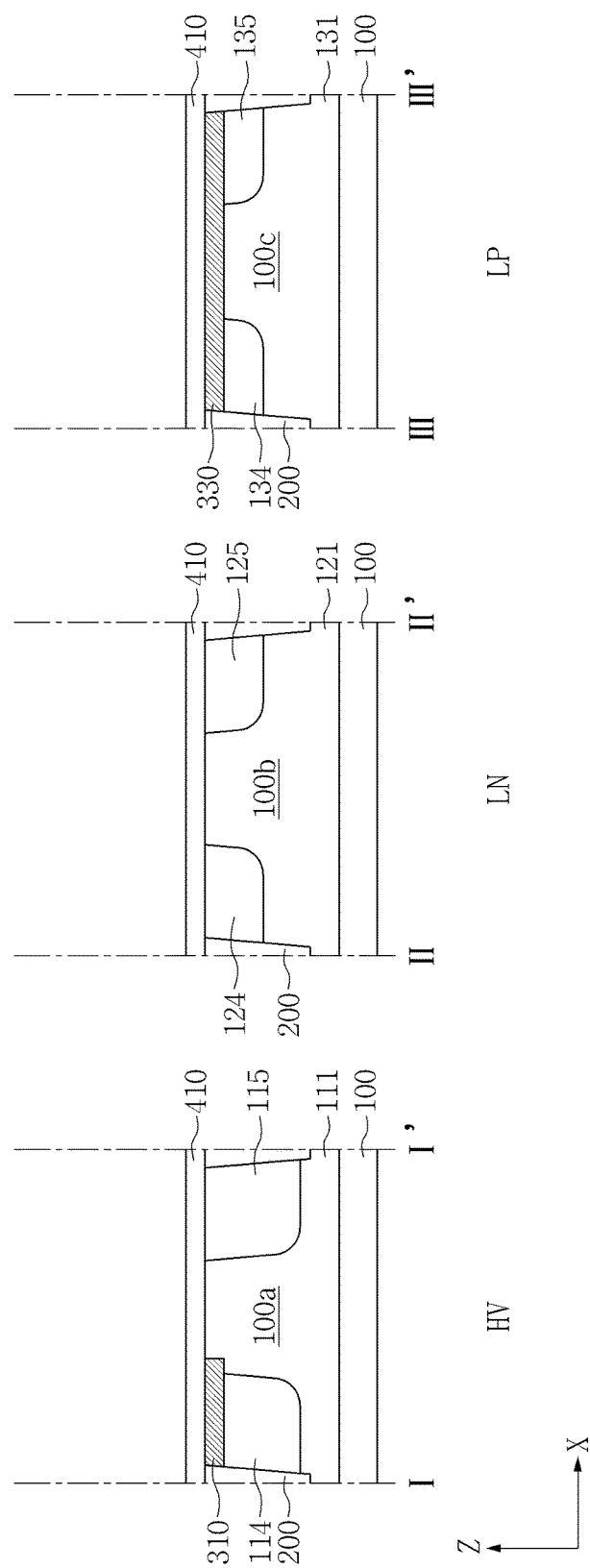

As illustrated in FIG. 6I, the exemplary method of forming the semiconductor device may include a process of forming a first gate insulating layer 410 on the substrate 100 from which the buffer insulating layer 810 has been removed.

The first gate insulating layer 410 may include an insulating material. For example, the first gate insulating layer 410 may include silicon oxide and/or silicon nitride.

Figure 6J:
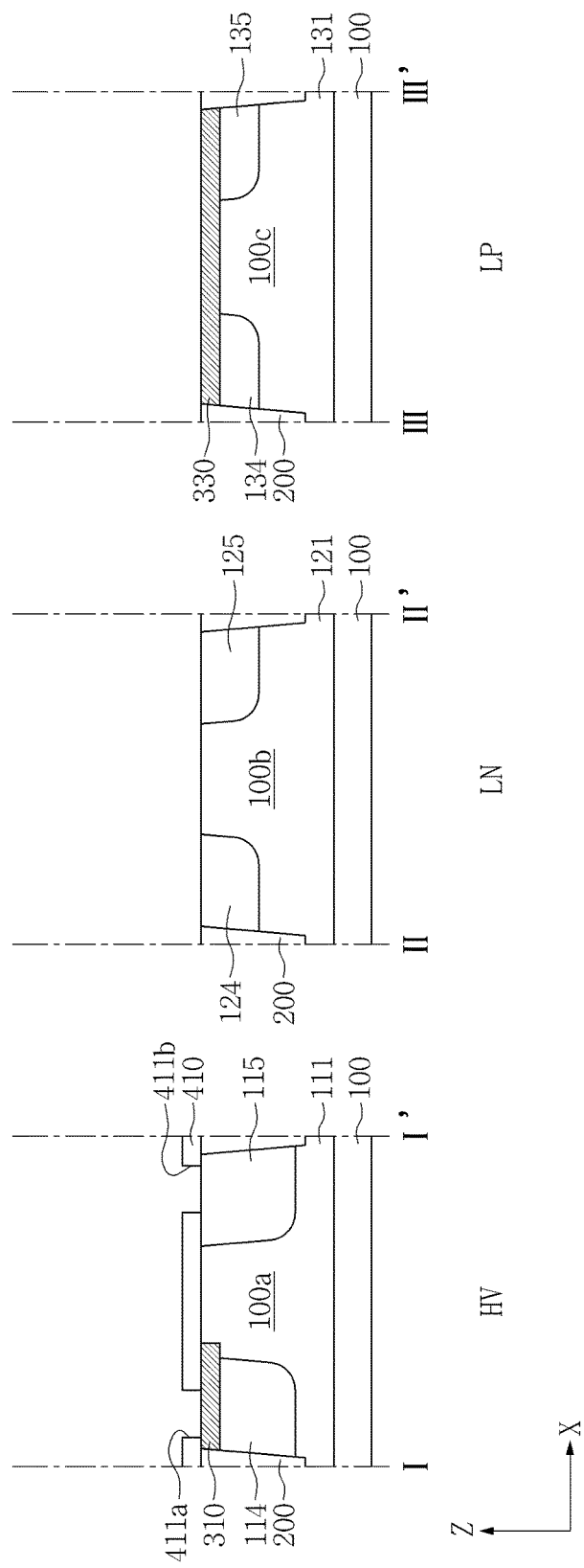

As illustrated in FIG. 6J, the exemplary method of forming the semiconductor device may include a process of patterning the first gate insulating layer 410 to only cover a portion of the first active region 100a.

The process of patterning the first gate insulating layer 410 may include a process of forming a first GI opening 411a and a second GI opening 411b in the first gate insulating layer 410 disposed on the first active region 100a, and a process of removing the first gate insulating layer 410 disposed on the second active region 100b and the third active region 100c. The process of removing the first gate insulating layer 410 disposed on the second active region 100b and the third active region 100c may be performed simultaneously or concurrently with the process of forming the first GI opening 411a and the second GI opening 411b.

The first GI opening 411a may be formed on the source DDD region 114. The first GI opening 411a may be formed on the first sub-active region 310. A horizontal length of the first GI opening 411a may be smaller than the horizontal length of the first sub-active region 310. The horizontal length of the first GI opening 411a may be smaller than the horizontal length of the source DDD region 114. An upper surface of the first sub-active region 310 may be partially exposed by the first GI opening 411a.

The second GI opening 411b may be formed on the drain DDD region 115. A horizontal length of the second GI opening 411b may be smaller than the horizontal length of the drain DDD region 115. An upper surface of the drain DDD region 115 may be partially exposed by the second GI opening 411b. The horizontal length of the second GI opening 411b may be equal to the horizontal length of the first GI opening 411a. As illustrated in FIG. 6J, the horizontal lengths may be lengths measured in a same first direction (e.g., the X-direction).

Figure 6K:
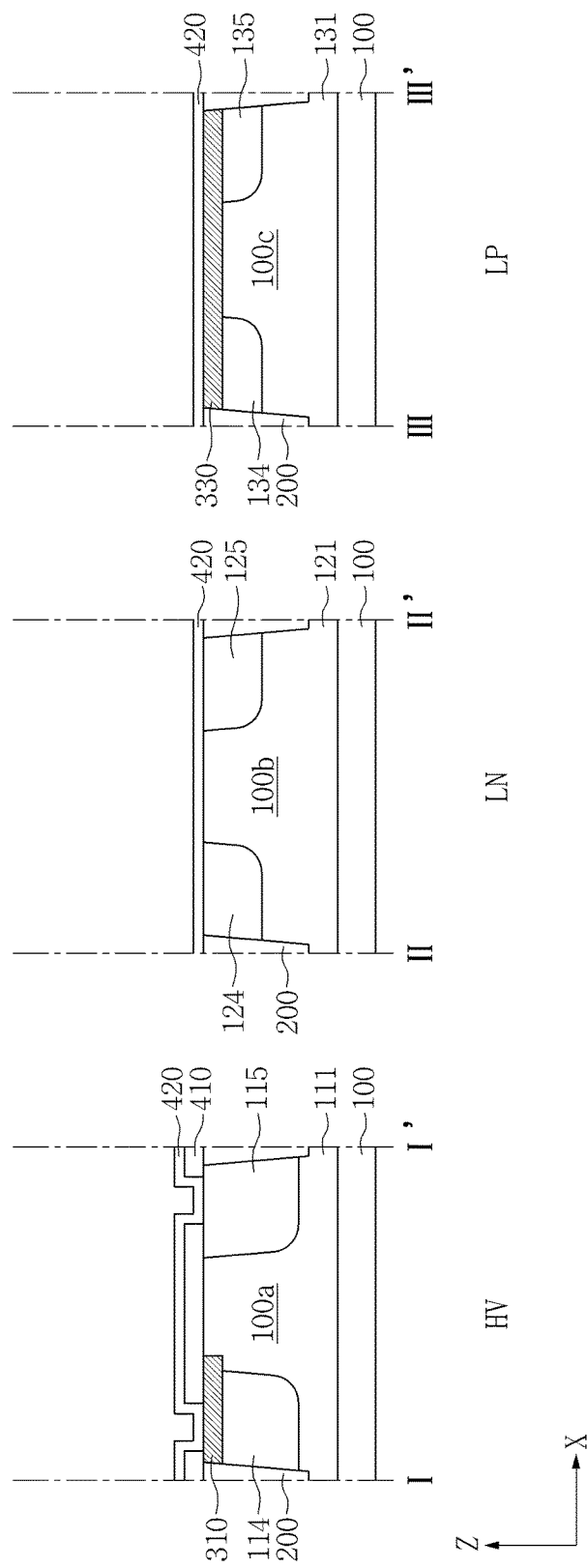

As illustrated in FIG. 6K, the exemplary method of forming the semiconductor device may include a process of forming a second gate insulating layer 420 on the substrate 100 including a first gate insulating layer 410, which is patterned.

The second gate insulating layer 420 may include an insulating material. For example, the second gate insulating layer 420 may include silicon oxide and/or silicon nitride. The second gate insulating layer 420 may include the same material as the first gate insulating layer 410. The vertical thickness of the second gate insulating layer 420 may be smaller than a vertical thickness of the first gate insulating layer 410. The vertical thickness may be a thickness measured in a third direction (e.g., a Z-direction).

Figure 6L:
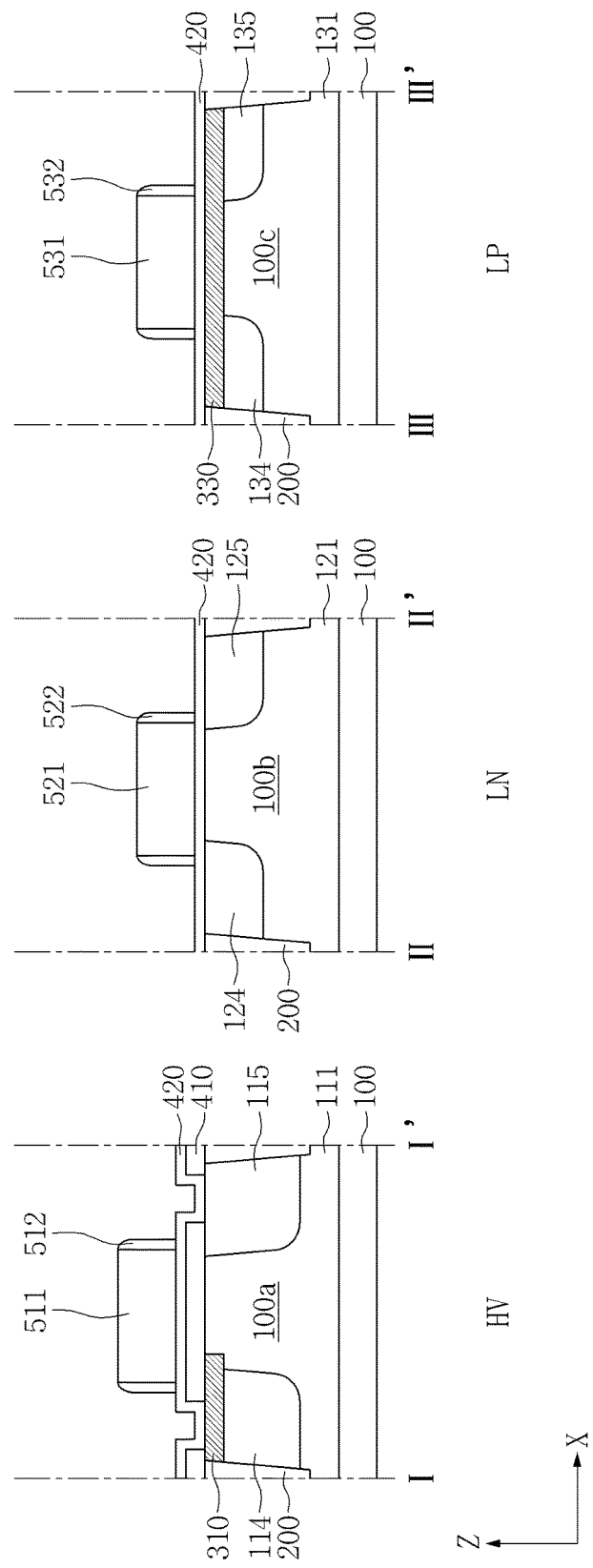

As illustrated in FIG. 6L, the exemplary method of forming the semiconductor device may include a process of forming a first gate pattern 511, a first gate spacer 512, a second gate pattern 521, a second gate spacer 522, a third gate pattern 531, and a third gate spacer 532 on the substrate 100 on which the second gate insulating layer 420 is formed.

The process of forming the first gate pattern 511, the first gate spacer 512, the second gate pattern 521, the second gate spacer 522, the third gate pattern 531 and the third gate spacer 532 may include a process of forming the first gate pattern 511 on the first active region 100a, a process of forming the second gate pattern 521 on the second active region 100b, a process of forming the third gate pattern 531 on the third active region 100c, a process of forming the first gate spacer 512 on a side surface of the first gate pattern 511, a process of forming the second gate spacer 522 on a side surface of the second gate pattern 521, and a process of forming the third gate spacer 532 on a side surface of the third gate pattern 531.

The first gate pattern 511 may be formed to vertically overlap the first active region 100a between the source DDD region 114 and the drain DDD region 115. The first gate pattern 511 may vertically overlap a portion of the source DDD region 114 and the drain DDD region 115. One side surface of the first sub-active region 310 may vertically overlap the first gate pattern 511. The second gate pattern 521 may be formed to vertically overlap the second active region 100b between the first source LDD region 124 and the first drain LDD region 125. The second gate pattern 521 may vertically overlap a portion of the first source LDD region 124 and the first drain LDD region 125. The third gate pattern 531 may be formed to vertically overlap the third active region 100c between the second source LDD region 134 and the second drain LDD region 135. The third gate pattern 531 may vertically overlap a portion of the second source LDD region 134 and the second drain LDD region 135.

The first gate pattern 511, the second gate pattern 521, and the third gate pattern 531 may include a conductive material. The first gate pattern 511, the second gate pattern 521, and the third gate pattern 531 may include the same material. For example, a process of forming the first gate pattern 511, a process of forming the second gate pattern 521, and a process of forming the third gate pattern 531 may be performed simultaneously or concurrently.

The first gate spacer 512, the second gate spacer 522, and the third gate spacer 532 may include an insulating material. For example, the first gate spacer 512, the second gate spacer 522, and the third gate spacer 532 may each include silicon oxide and/or silicon nitride. The first gate spacer 512, the second gate spacer 522, and the third gate spacer 532 may include the same material. For example, a process of forming the first gate spacer 512, a process of forming the second gate spacer 522, and a process of forming the third gate spacer 532 may be performed simultaneously or concurrently.

Figure 6M:
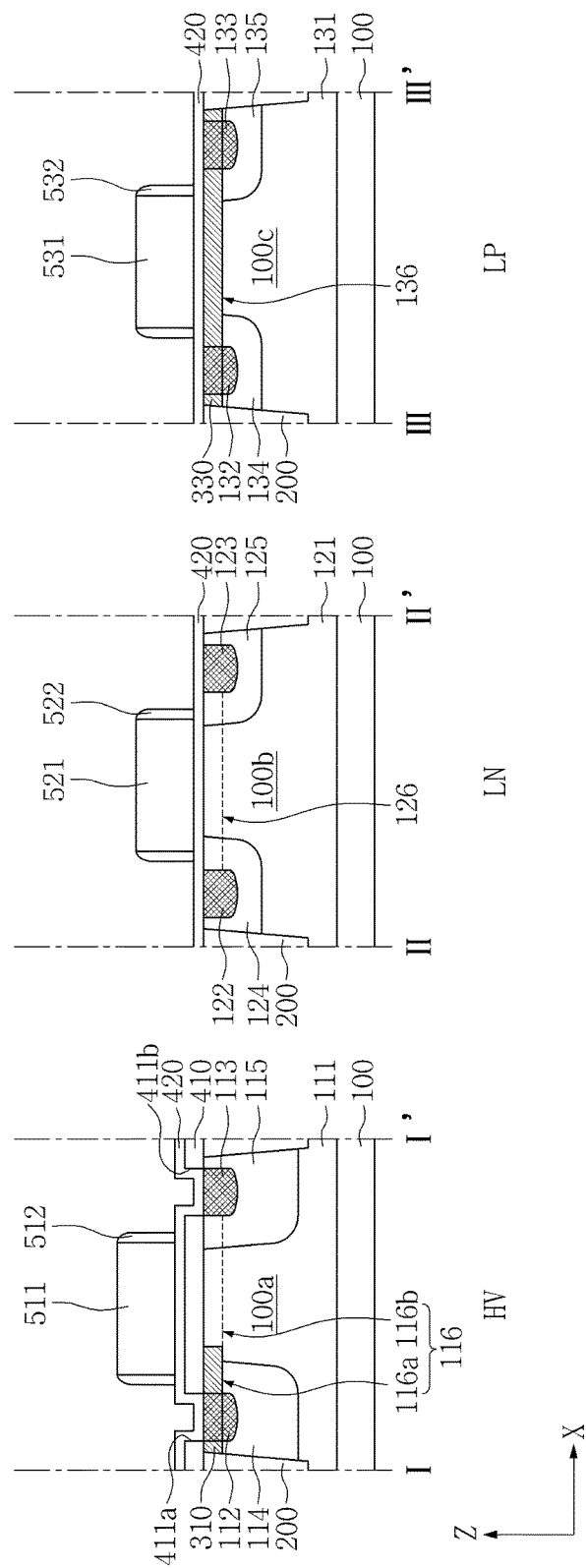

As illustrated in FIG. 6M, the exemplary method of forming the semiconductor device may include a process of forming a first source region portion 112 and a first drain region portion 113, a second source region portion 122 and a second drain region portion 123, a third source region portion 132 and a third drain region portion 133 in the substrate 100 in which the respective first gate pattern 511, the second gate pattern 521, and the third gate pattern 531 have been formed.

The process of forming the first source region portion 112, the first drain region portion 113, the second source region portion 122, the second drain region portion 123, the third source region portion 132, and the third drain region portion 133 may include a process of forming the first source region portion 112 and the first drain region portion 113 in the first active region 100a, a process of forming the second source region portion 122 and the second drain region portion 123 in the second active region 100b, and a process of forming the third source region portion 132 and the third drain region portion 133 in the third active region 100c.

The first source region portion 112 may be formed in the source DDD region 114. The first drain region portion 113 may be formed in the drain DDD region 115. For example, the process of forming the first source region portion 112 and the first drain region portion 113 may include a process of doping a conductive impurity into certain portions of the source DDD region 114 and the drain DDD region 115. The first source region portion 112 and the first drain region portion 113 may include a conductive impurity different from those of the source DDD region 114 and the drain DDD region 115. The first source region portion 112 and the first drain region portion 113 may include a conductive impurity different from the first well region 111. For example, when the first well region 111 includes a P-type impurity, the first source region portion 112 and the first drain region portion 113 may include an N-type impurity.

The first source region portion 112 may be formed in the source DDD region 114 of which an upper surface is exposed by the first GI opening 411a of the first gate insulating layer 410. For example, a horizontal length of the first source region portion 112 may be smaller than the horizontal length of the source DDD region 114. The horizontal length of the first source region portion 112 may be smaller than the horizontal length of the first sub-active region 310. A portion of the first sub-active region 310 may serve as the first source region portion 112. The lowest level of the first source region portion 112 may be lower than the lowest end level of the first sub-active region 310.

The first drain region portion 113 may be formed in the drain DDD region 115 of which an upper surface is exposed by the second GI opening 411*b* of the first gate insulating layer 410. For example, a horizontal length of the first drain region portion 113 may be smaller than the horizontal length of the drain DDD region 115. The horizontal length of the first drain region portion 113 may be equal to the horizontal length of the first source region portion 112. The lowest level of the first drain region portion 113 may be equal to the lowest level of the first source region portion 112.

The first active region 100*a* between the first source region portion 112 and the first drain region portion 113 may serve as a first channel region 116. The first channel region 116 may include a first portion 116*a* included in the first sub-active region 310 and a second portion 116*b* included in the first well region 111.

In the exemplary method of forming the semiconductor device, the first portion 116*a* of the first channel region 116 may be formed to have a lower threshold voltage than the second portion 116*b* of the first channel region 116. That is, in the exemplary method of forming the semiconductor device, the first portion 116*a* of the first channel region 116 may be turned on earlier than the second portion 116*b* of the first channel region 116. Therefore, in the exemplary method of forming the semiconductor device, the current characteristic of the first channel region 116 may be improved without the change in the threshold voltage in the second portion 116*b* of the first channel region 116 located close to a first drain region portion 113.

The second source region portion 122 may be formed in the first source LDD region 124. The second drain region portion 123 may be formed in the first drain LDD region 125. For example, a process of forming the second source region portion 122 and the second drain region portion 123 may include a process of doping a conductive impurity into certain portions of the first source LDD region 124 and the first drain LDD region 125. The second source region portion 122 and the second drain region portion 123 may include a conductive impurity different from those of the first source LDD region 124 and the first drain LDD region 125. The second source region portion 122 and the second drain region portion 123 may include a conductive impurity different from the second well region 121. For example, when the second well region 121 includes a P-type impurity, the second source region portion 122 and the second drain region portion 123 may include an N-type impurity. The second active region 100*b* between the second source region portion 122 and the second drain region portion 123 may serve as a second channel region 126.

The third source region portion 132 may be formed in the second source LDD region 134. The third drain region portion 133 may be formed in the second drain LDD region 135. For example, a process of the third source region portion 132 and the third drain region portion 133 may include a process of doping a conductive impurity into certain portions of the second source LDD region 134 and the second drain LDD region 135. The third source region portion 132 and the third drain region portion 133 may include a conductive impurity different from those of the second source LDD region 134 and the second drain LDD region 135. The third source region portion 132 and the third drain region portion 133 may include a conductive impurity different from the third well region 131. For example, when the third well region 131 includes an N-type impurity, the third source region portion 132 and the third drain region portion 133 may include a P-type impurity.

The third active region 100*c* between the third source region portion 132 and the third drain region portion 133 may serve as a third channel region 136. The third channel region 136 may include the second sub-active region 330.

As illustrated in FIGS. 1A and 1B, the method of forming the exemplary semiconductor device may include a process of forming an interlayer insulating layer 600 on the substrate 100 in which the first source region portion 112, the first drain region portion 113, the second source region portion 122, the second drain region portion 123, the third source region portion 132, and the third drain region portion 133 are formed, and a process of forming a first source contact structure 711, a first drain contact structure 712, a first gate contact structure 713, a second source contact structure 721, a second drain contact structure 722, a second gate contact structure 723, a third source contact structure 731, a third drain contact structure 732, and a third gate contact structure 733 which pass through the interlayer insulating layer 600.

The process of forming the interlayer insulating layer 600 may include a process of covering the first gate pattern 511, the second gate pattern 521, and the third gate pattern 531 with the interlayer insulating layer 600. For example, an upper surface of the interlayer insulating layer 600 may be higher than those of the first gate pattern 511, the second gate pattern 521, and the third gate pattern 531.

The interlayer insulating layer 600 may include an insulating material. For example, the interlayer insulating layer 600 may include silicon oxide and/or silicon nitride.

The first source contact structure 711 may be formed on the first source region portion 112. The first source contact structure 711 may be electrically connected to the first source region portion 112. For example, the first source contact structure 711 may be in direct contact with the first source region portion 112. The first source contact structure 711 may be in direct contact with the first sub-active region 310.

The first source contact structure 711 may include a conductive material. For example, the first source contact structure 711 may include a metal.

The first source contact structure 711 may include a first source silicide contact 711*a* located close to the first source region portion 112. The lowest end level of the first source silicide contact 711*a* may be lower than the highest end level of the first sub-active region 310. The lowest end level of the first source silicide contact 711*a* may be higher than the lowest end level of the first sub-active region 310.

The first drain contact structure 712 may be formed on the first drain region portion 113. The first drain contact structure 712 may be electrically connected to the first drain region portion 113. For example, the first drain contact structure 712 may be in direct contact with the first drain region portion 113.

The first drain contact structure 712 may include a conductive material. For example, the first drain contact structure 712 may include a metal. The first drain contact structure 712 may include the same material as the first source contact structure 711.

The first drain contact structure 712 may include a first drain silicide contact 712*a* located close to the first drain region portion 113. The lowest end level of the first drain silicide contact 712*a* may be lower than the highest end level of the first drain region portion 113. For example, the lowest end level of the first drain silicide contact 712a may be equal to that of the first source silicide contact 711a.

The first gate contact structure 713 may be formed on the first gate pattern 511. The first gate contact structure 713 need not vertically overlap the first active region 100a. For example, the first gate pattern 511 may intersect the first active region 100a between the first source region portion 112 and the first drain region portion 113, crossing over the first active region 100a.

The second source contact structure 721 may be formed on the second source region portion 122. The second source contact structure 721 may be electrically connected to the second source region portion 122. For example, the second source contact structure 721 may be in direct contact with the second source region portion 122.

The second source contact structure 721 may include a conductive material. For example, the second source contact structure 721 may include a metal.

The second source contact structure 721 may include a second source silicide contact 721a located close to the second source region portion 122. The lowest end level of the second source silicide contact 721a may be lower than the highest end level of the second source region portion 122.

The second drain contact structure 722 may be formed on the second drain region portion 123. The second drain contact structure 722 may be electrically connected to the second drain region portion 123. For example, the second drain contact structure 722 may be in direct contact with the second drain region portion 123.

The second drain contact structure 722 may include a conductive material. For example, the second drain contact structure 722 may include a metal. The second drain contact structure 722 may include the same material as the second source contact structure 721.

The second drain contact structure 722 may include a second drain silicide contact 722a located close to the second drain region portion 123. The lowest end level of the second drain silicide contact 722a may be lower than the highest end level of the second drain region portion 123. For example, the lowest end level of the second drain silicide contact 722a may be equal to that of the second source silicide contact 721a.

The second gate contact structure 723 may be formed on the second gate pattern 521. The second gate contact structure 723 need not vertically overlap the second active region 100b. For example, the second gate pattern 521 may intersect the second active region 100b between the second source region portion 122 and the second drain region portion 123, crossing over the second active region 100b.

The third source contact structure 731 may be formed on the third source region portion 132. The third source contact structure 731 may be electrically connected to the third source region portion 132. For example, the third source contact structure 731 may be in direct contact with the third source region portion 132.

The third source contact structure 731 may include a conductive material. For example, the third source contact structure 731 may include a metal.

The third source contact structure 731 may include a third source silicide contact 731a located close to the third source region portion 132. The lowest end level of the third source silicide contact 731a may be lower than the highest end level of the third source region portion 132.

The third drain contact structure 732 may be formed on the third drain region portion 133. The third drain contact structure 732 may be electrically connected to the third drain region portion 133. For example, the third drain contact structure 732 may be in direct contact with the third drain region portion 133.

The third drain contact structure 732 may include a conductive material. For example, the third drain contact structure 732 may include a metal. The third drain contact structure 732 may include the same material as the third source contact structure 731.

The third drain contact structure 732 may include a third drain silicide contact 732a located close to the third drain region portion 133. The lowest end level of the third drain silicide contact 732a may be lower than the highest end level of the third drain region portion 133. For example, the lowest end level of the third drain silicide contact 732a may be equal to that of the third source silicide contact 731a.

The third gate contact structure 733 may be formed on the third gate pattern 531. The third gate contact structure 733 need not vertically overlap the third active region 100c. For example, the third gate pattern 531 may intersect the third active region 100c between the third source region portion 132 and the third drain region portion 133, crossing over the third active region 100c.

As a result, in the method of forming the semiconductor device according to the embodiment, in the first portion HV of the substrate 100 to which a relatively high voltage is applied, the first portion 116a located close to a first source region portion 112 may form the first channel region 116 having a relatively low threshold voltage. Therefore, in the method of forming the semiconductor device according to the embodiment, the current performance of the first channel region 116 can be improved without an increase in the leakage current in the first portion HV.

In the semiconductor device according to the embodiment, the current performance of the channel region can be improved without the change in the threshold voltage of the channel region located close to the drain region portion. Therefore, in the semiconductor device according to the embodiment, the degree of integration increases without the increase in the leakage current.

The foregoing is illustrative of embodiments and is not to be construed as limiting thereof. Although a few embodiments have been described, those skilled in the art will readily appreciate that many modifications are possible without materially departing from the novel teachings and advantages.

What is claimed is:

1. A semiconductor device comprising:
   an active region including a first portion and a second portion disposed adjacent to the first portion in a first direction;
   a source region portion disposed in the first portion of the active region, the source region portion having a first conductivity type;
   a drain region portion disposed in the second portion of the active region, the drain region portion having the first conductivity type;
   a channel region disposed between the source region portion and the drain region portion; and
   a gate pattern extending in a second direction perpendicular to the first direction and intersecting the active region between the source region portion and the drain region portion,
   wherein the first portion of the active region has a first work function and the second portion of the active region has a second work function,
   wherein the first work function is lower than the second work function, wherein a MOSFET transistor is formed by the active region comprising a source including the source region portion, a drain comprising the drain region portion, the channel region, and a gate formed by the gate pattern, and wherein at least some of the first portion is not part of the source of the MOSFET transistor.

2. The semiconductor device of claim 1,
wherein a boundary is located between the first portion and the second portion of the active region, and
wherein the boundary is located between the center of the gate pattern and the source region portion.

3. The semiconductor device of claim 1, wherein the first portion of the active region includes a material not included in the second portion of the active region.

4. The semiconductor device of claim 3, wherein the first portion of the active region includes SiGe.

5. The semiconductor device of claim 1, wherein a length of the first portion of the active region in the first direction is smaller than a length of the second portion of the active region in the first direction.

6. The semiconductor device of claim 5, wherein a length of the first portion of the active region in the second direction is equal to a length of the second portion of the active region in the second direction.

7. The semiconductor device of claim 1, wherein a boundary is located between the first portion and the second portion of the active region, and
wherein a first distance between the boundary and the source region portion is smaller than a second distance between the boundary and the drain region portion.

8. The semiconductor device of claim 7, wherein the gate pattern overlaps the boundary between the first portion and the second portion of the active region.

9. A semiconductor device comprising:
a source region portion disposed in a substrate, the source region portion having a first conductivity type;
a drain region portion disposed in the substrate, the drain region portion having the first conductivity type;
a channel region disposed between the source region portion and the drain region portion, the channel region including a first portion and a second portion disposed adjacent to the first portion; and
a gate pattern disposed on the channel region of the substrate,
wherein the first portion of the channel region is located closer to the source region portion than to the drain region portion,
wherein a threshold voltage of the second portion is higher than a threshold voltage of the first portion, and
wherein at least one of the first portion and the second portion comprises an element forming a semiconductor material that is not present in the other of the first portion and the second portion.

10. The semiconductor device of claim 9, wherein the first portion of the channel region includes a side surface that is vertically overlapped by the gate pattern.

11. The semiconductor device of claim 9, wherein the first portion of the channel region includes a first material having a first work function and the second portion of the channel region includes a second material having a second work function, and
wherein the first work function is lower than the second work function.

12. The semiconductor device of claim 9, wherein a lowest level of the source region portion is lower than a lowest end level of the first portion of the channel region.

13. The semiconductor device of claim 9, further comprising:
a source DDD region surrounding at least a portion of the source region portion; and
a drain DDD region surrounding the drain region portion, the drain DDD region being separated from the source DDD region,
wherein a highest end level of the drain DDD region is higher than a highest end level of the source DDD region.

14. The semiconductor device of claim 13, wherein the first portion of the channel region has a first horizontal length measured in a first direction and the source DDD region has a second horizontal length measured in the first direction, and
wherein the first horizontal length is larger than the second horizontal length.

15. The semiconductor device of claim 13, wherein a highest end level of the source DDD region is equal to a lowest end level of the first portion of the channel region.

16. A semiconductor device comprising:
a source region portion disposed in a substrate, the source region portion having a first conductivity type;
a drain region portion disposed in the substrate, the drain region portion having the first conductivity type;
a channel region disposed between the source region portion and the drain region portion, the channel region including a first portion disposed adjacent to the source region portion and a second portion disposed adjacent to the drain region portion; and
a gate pattern disposed on the channel region of the substrate,
wherein a threshold voltage of the second portion is higher than a threshold voltage of the first portion,
wherein the first portion of the channel region includes a side surface at a boundary between the first portion and the second portion,
wherein the gate pattern vertically overlaps the side surface, and
wherein at least one of the first portion and the second portion comprises an element forming a semiconductor material that is not present in the other of the first portion and the second portion.

17. The semiconductor device of claim 16, wherein the first portion of the channel region has a first work function and the second portion of the channel region has a second work function, and
wherein the first work function is lower than the second work function.

18. The semiconductor device of claim 16, wherein a lowest boundary of the source region portion is lower than a lowest boundary of the first portion of the channel region.

19. The semiconductor device of claim 16, further comprising:
a source DDD region surrounding at least a portion of the source region portion; and
a drain DDD region surrounding the drain region portion,
wherein a highest end level of the drain DDD region is higher than a highest end level of the source DDD region.

20. The semiconductor device of claim 19, wherein the first portion of the channel region has a first horizontal length measured in a first direction and the source DDD region has a second horizontal length measured in the first direction, and wherein the first horizontal length is larger than the second horizontal length.

* * * * *